United States Patent
Sakurai et al.

(10) Patent No.: US 11,869,593 B2
(45) Date of Patent: Jan. 9, 2024

(54) SEMICONDUCTOR MEMORY DEVICE

(71) Applicant: Kioxia Corporation, Tokyo (JP)

(72) Inventors: Katsuaki Sakurai, Yokohama Kanagawa (JP); Osamu Kobayashi, Sagamihara Kanagawa (JP); Tomonori Kurosawa, Zama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 183 days.

(21) Appl. No.: 17/575,724

(22) Filed: Jan. 14, 2022

(65) Prior Publication Data

US 2022/0392531 A1 Dec. 8, 2022

(30) Foreign Application Priority Data

Jun. 2, 2021 (JP) ................................. 2021-093006

(51) Int. Cl.
*G11C 16/08* (2006.01)
*G11C 16/26* (2006.01)
*H10B 41/41* (2023.01)
*H10B 43/40* (2023.01)

(52) U.S. Cl.
CPC ............. *G11C 16/08* (2013.01); *G11C 16/26* (2013.01); *H10B 41/41* (2023.02); *H10B 43/40* (2023.02)

(58) Field of Classification Search
CPC .............................. G11C 16/08; H01B 43/40
USPC ......................................................... 365/232
See application file for complete search history.

(56) References Cited

U.S. PATENT DOCUMENTS

| | | | | |
|---|---|---|---|---|
| 5,818,210 A | * | 10/1998 | Ueno | H03M 1/46 365/45 |
| 5,903,498 A | * | 5/1999 | Campardo | G11C 16/08 365/189.11 |
| 7,245,526 B2 | * | 7/2007 | Oh | G11C 13/0026 365/163 |
| 8,947,946 B2 | | 2/2015 | Yamada | |
| 9,105,357 B2 | * | 8/2015 | Namai | G11C 29/028 |
| 10,008,276 B2 | | 6/2018 | Huynh et al. | |
| 2013/0249728 A1 | * | 9/2013 | Ikeda | H03M 1/1038 341/155 |

* cited by examiner

*Primary Examiner* — Muna A Techane
(74) *Attorney, Agent, or Firm* — Holtz, Holtz & Volek PC

(57) ABSTRACT

According to an embodiment, a semiconductor memory device includes a memory cell, a first word line coupled between a control end of the memory cell and a first node, a resistance element coupled between the first node and a second node, a control circuit configured to output a voltage to the second node, a first switch coupled between the first node and a third node, a second switch coupled between the second node and the third node, and a comparator including an input end that receives a signal corresponding to a voltage of the third node.

17 Claims, 13 Drawing Sheets

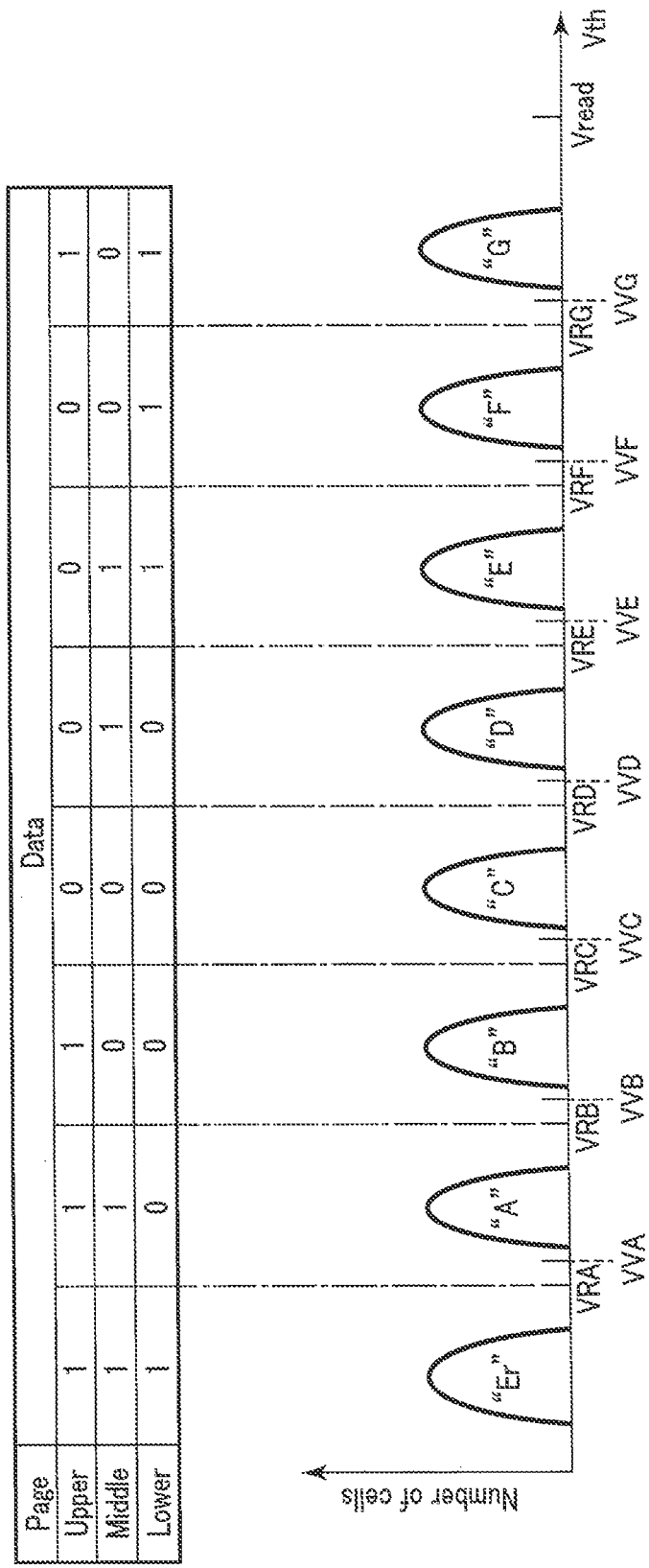
F I G. 5

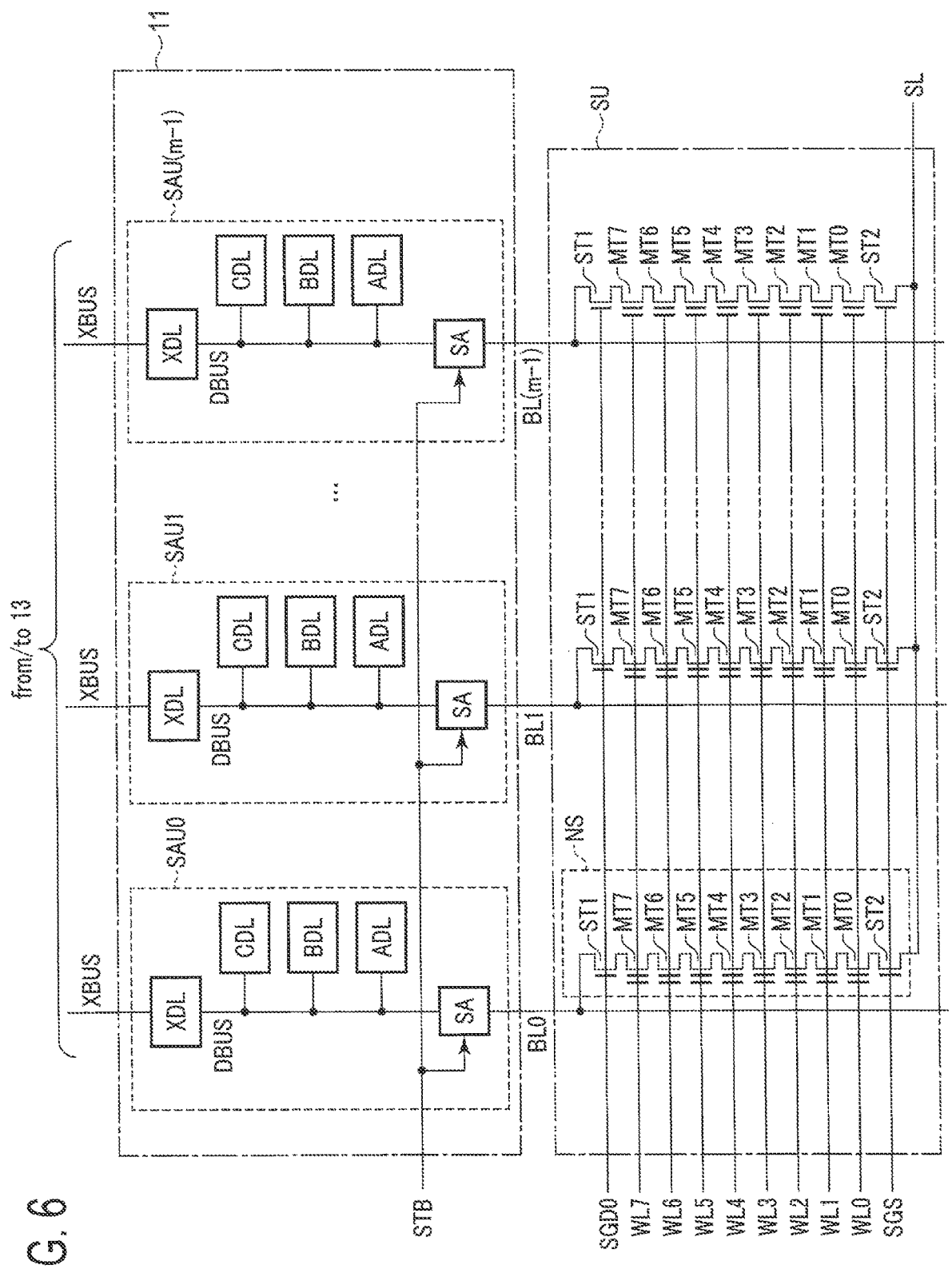
F I G. 6

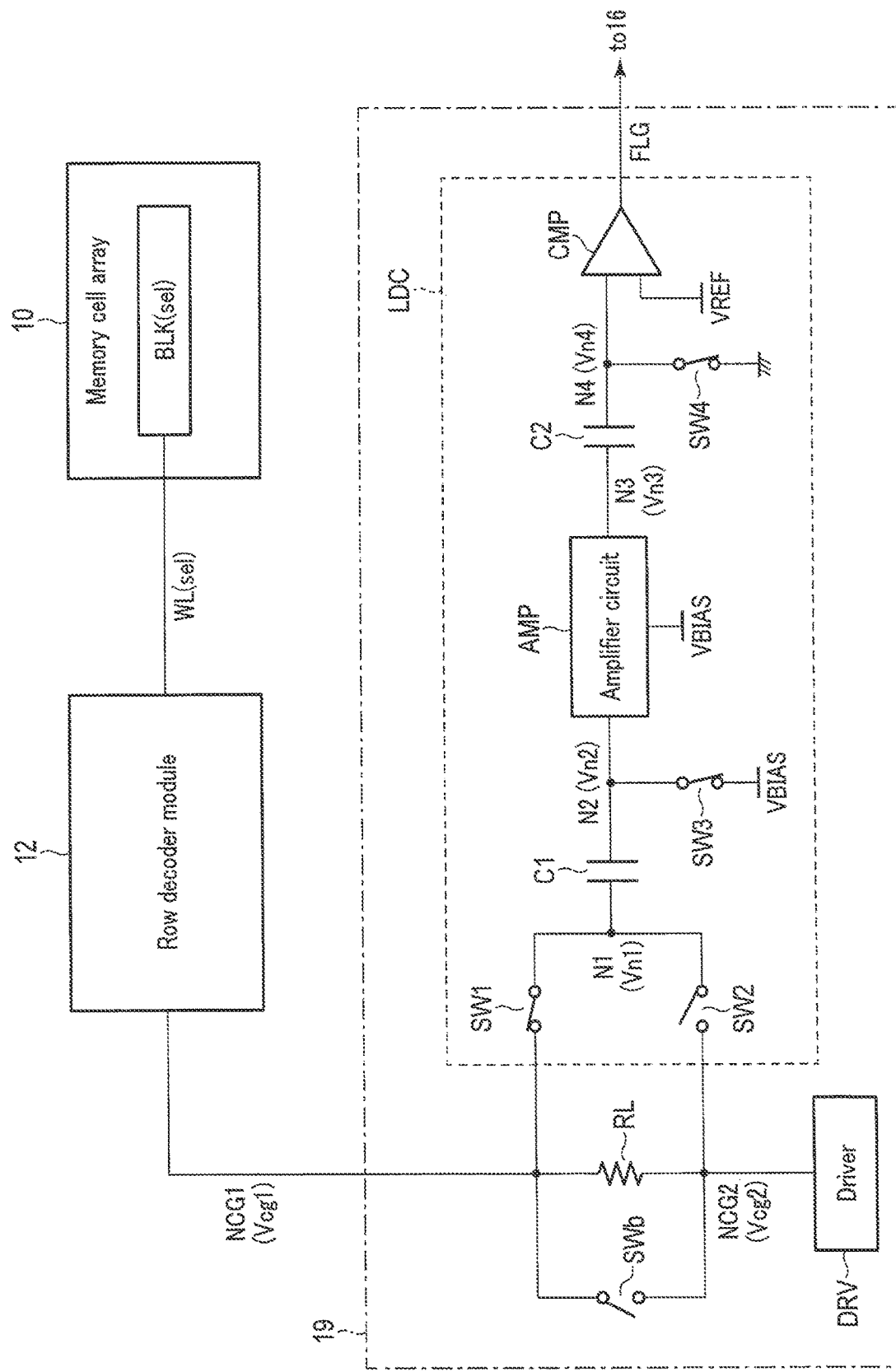
F I G. 7

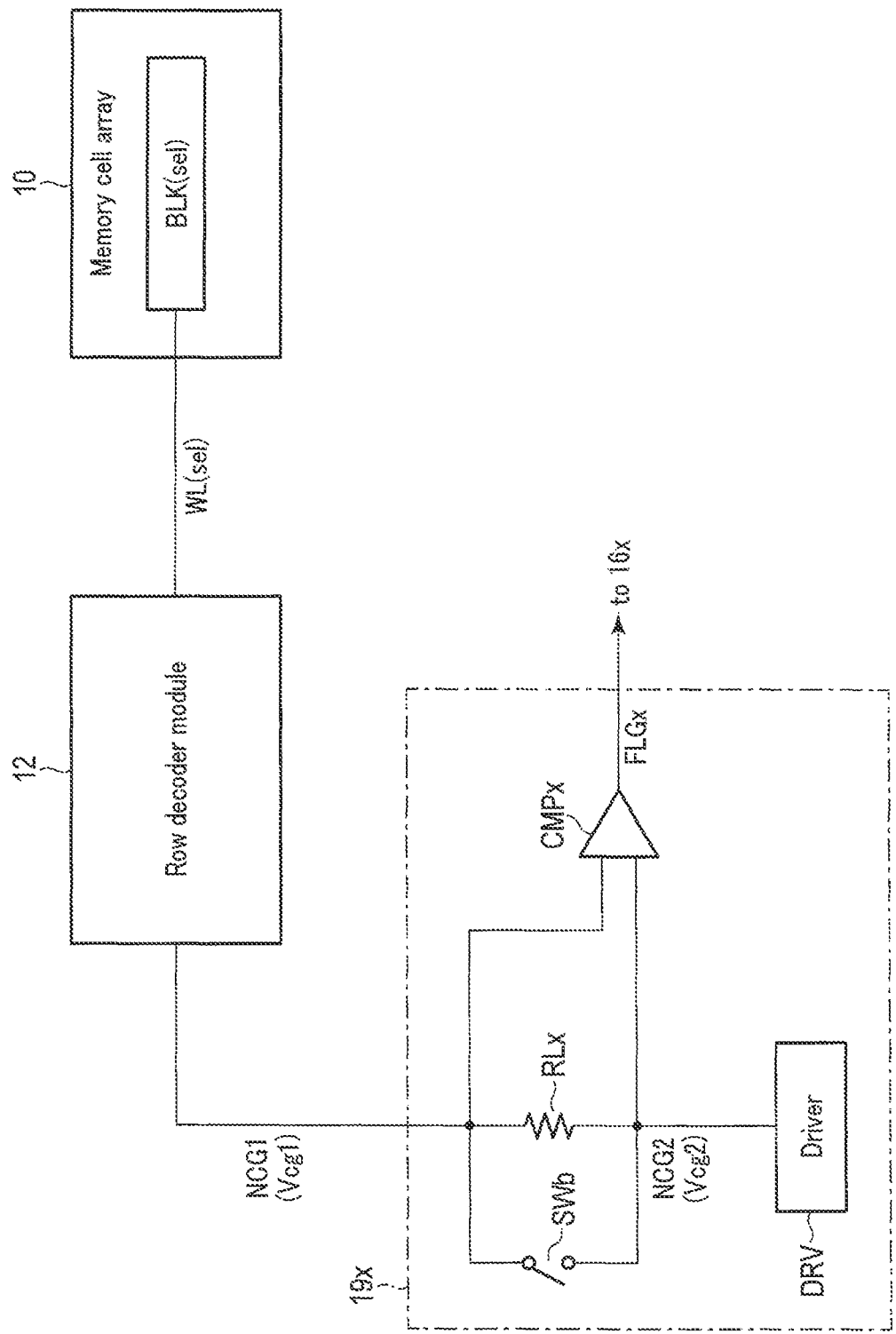
F I G. 11

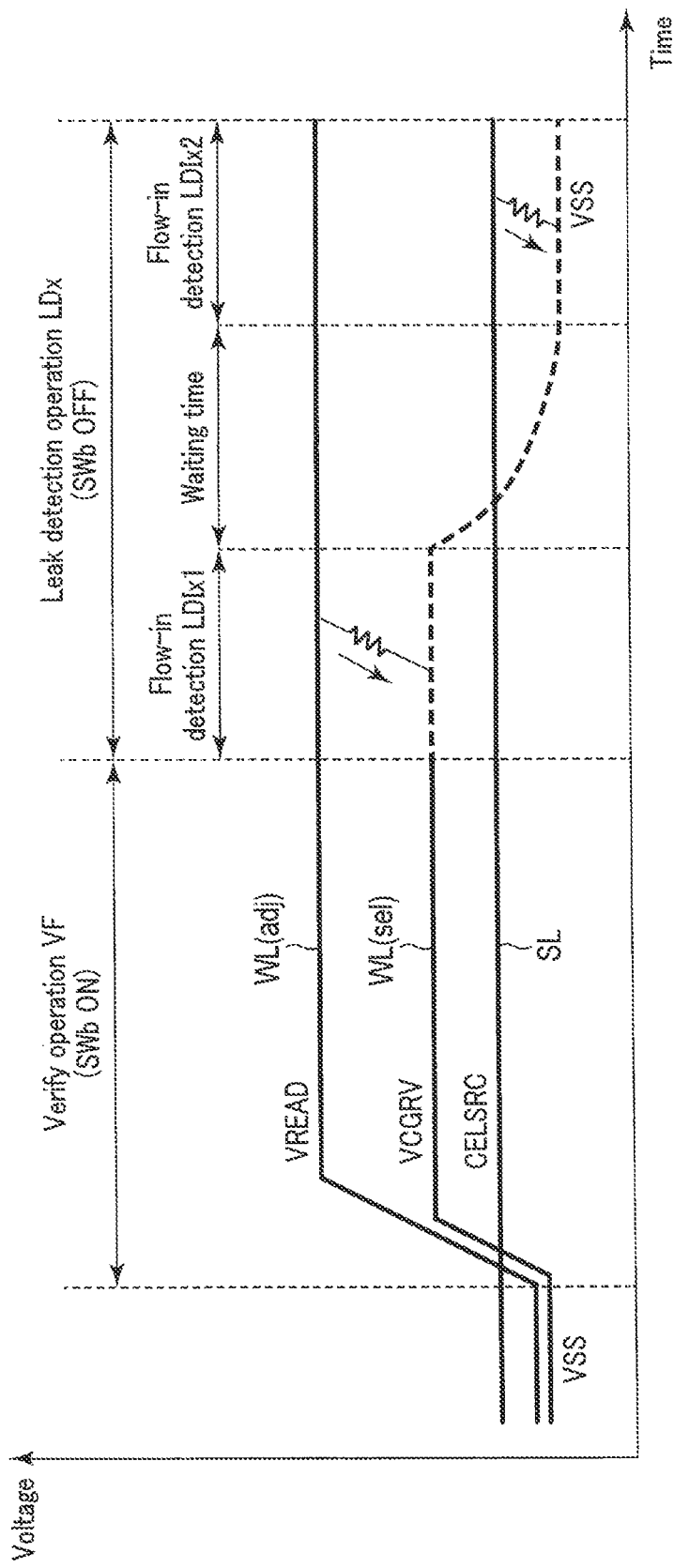
F I G. 12

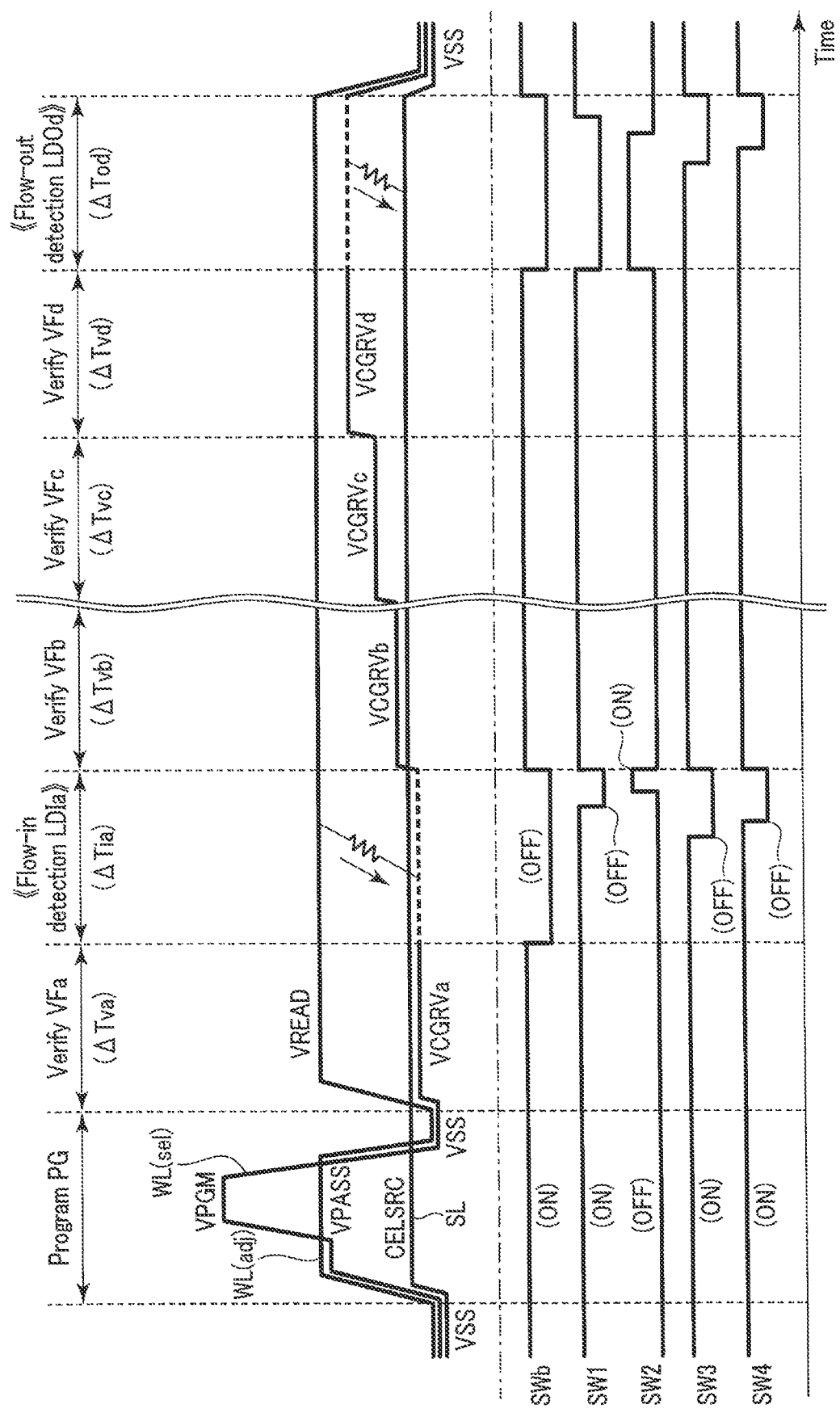
F I G. 13

SEMICONDUCTOR MEMORY DEVICE

CROSS-REFERENCE TO RELATED APPLICATIONS

This application is based upon and claims the benefit of priority from Japanese Patent Application No. 2021-093006, filed Jun. 2, 2021, the entire contents of which are incorporated herein by reference.

FIELD

Embodiments described herein relate to a semiconductor memory device.

BACKGROUND

A NAND flash memory is known as a semiconductor memory device.

BRIEF DESCRIPTION OF THE DRAWINGS

FIG. 5 shows an example of threshold voltage distributions formed by memory cell transistors of the semiconductor memory device according to the first embodiment.

FIG. 6 is a block diagram showing an example of a configuration of a sense amplifier module of the semiconductor memory device according to the first embodiment.

FIG. 7 shows an example of a configuration of a driver set of the semiconductor memory device according to the first embodiment.

FIG. 11 shows an example of a configuration of a driver set of a semiconductor memory device according to a comparative example of the first embodiment.

FIG. 12 shows an example of a timing chart showing temporal changes of voltages applied to various interconnects at the time of execution of a leakage detection operation subsequent to a verify operation by the semiconductor memory device according to the comparative example of the first embodiment.

FIG. 13 shows an example of a timing chart showing temporal changes of voltages applied to various interconnects at the time of sequential execution of verify operations subsequent to a program operation by the semiconductor memory device according to a modification of the first embodiment.

DETAILED DESCRIPTION

In general, according to an embodiment, a semiconductor memory device includes a memory cell, a first word line coupled between a control end of the memory cell and a first node, a resistance element coupled between the first node and a second node, a control circuit configured to output a voltage to the second node, a first switch coupled between the first node and a third node, a second switch coupled between the second node and the third node, and a comparator including an input end that receives a signal corresponding to a voltage of the third node.

Hereinafter, embodiments will be described with reference to the accompanying drawings. In the description that follows, components whose function and configuration are identical will be assigned a common reference sign. When a plurality of components with a common reference sign are distinguished, suffixes are appended to the common reference sign to make such distinction. When a plurality of components need not be particularly distinguished, such components are assigned only the common reference sign, with no suffix appended.

Each functional block can be implemented in the form of hardware, software, or a combination of both. The functional blocks need not necessarily be distinguished, as will be described in the following. For example, some of the functions may be executed by a functional block different from the functional block to be described as an example. In addition, the functional blocks to be described as an example may be further divided into smaller functional sub-blocks. The names of the functional blocks and the components in the description that follows are for convenience, and are not intended to limit the configurations or operations of the functional blocks and the components.

First Embodiment

Hereinafter, a description will be given of a semiconductor memory device 1 according to a first embodiment.

Configuration Example (1) Memory System

Figure 1:
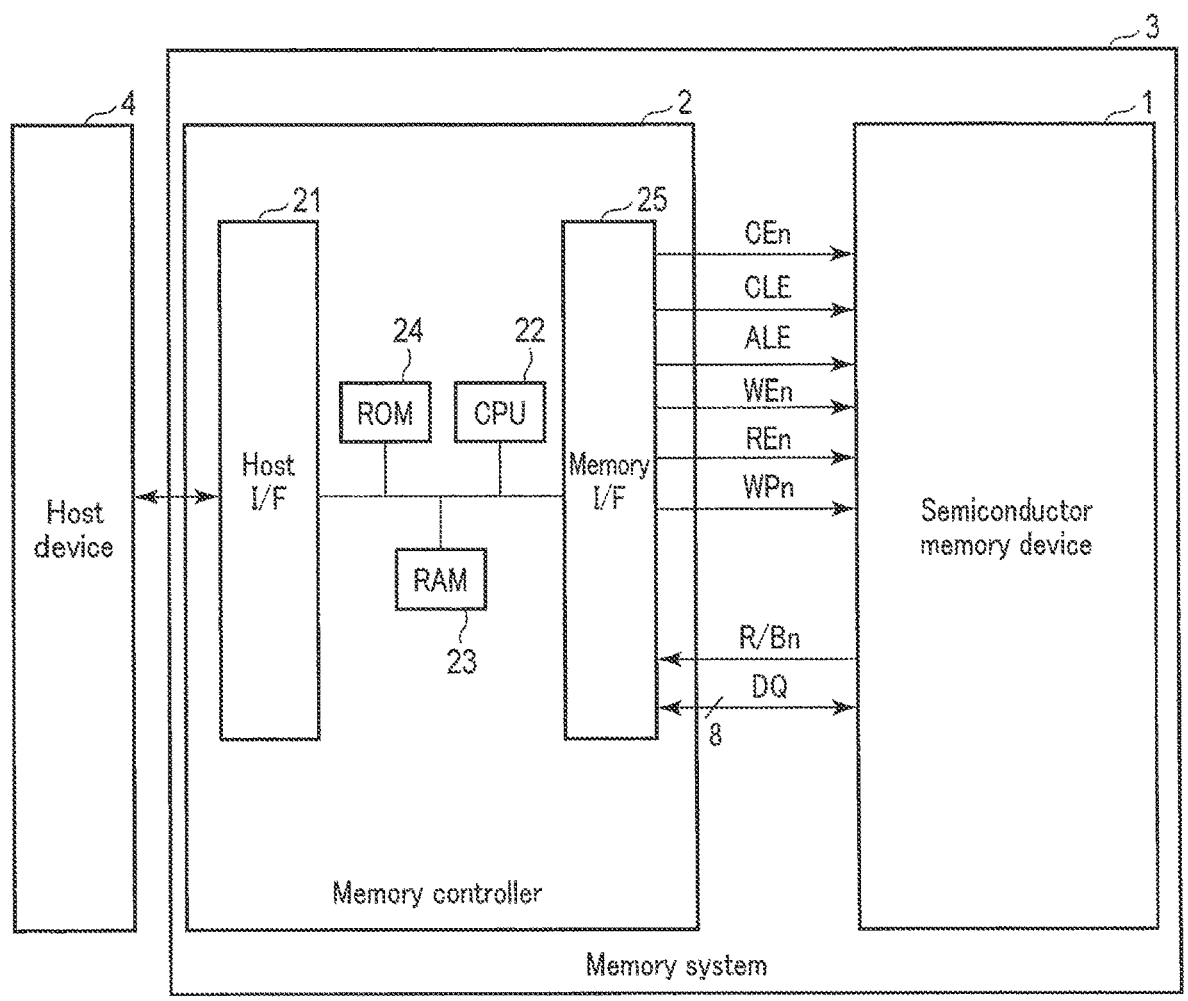
FIG. 1 is a block diagram showing an example of a configuration of a memory system including a semiconductor memory device according to a first embodiment.

FIG. 1 is a block diagram showing an example of a configuration of a memory system 3 including the semiconductor memory device 1 according to the first embodiment. The memory system 3 includes the semiconductor memory device 1 and a memory controller 2, and is controlled by a host device 4. The memory system 3 is, for example, a solid-state drive (SSD), an SD™ card, or the like.

The semiconductor memory device 1 is controlled by the memory controller 2. The memory controller 2 receives a host command from the host device 4, and controls the semiconductor memory device 1 based on the host command.

The memory controller 2 includes a host interface circuit 21, a central processing unit (CPU) 22, a random access memory (RAM) 23, a read-only memory (ROM) 24, and a memory interface circuit 25. The memory controller 2 is configured as, for example, a system on a chip (SoC).

The ROM 24 stores firmware (programs). The RAM 23 is capable of storing the firmware, and is used as a work area of the CPU 22. Furthermore, the RAM 23 stores data temporarily, and functions as a buffer and a cache. The firmware stored in the ROM 24 and loaded onto the RAM 23 is executed by the CPU 22. Thereby, the memory controller 2 executes various operations including a write operation, a read operation, etc., and some of the functions of the host interface circuit 21 and the memory interface circuit 25.

The host interface circuit 21 is coupled to the host device 4 via a host interface, and manages communications between the memory controller 2 and the host device 4. For example, the host interface circuit 21 receives a host command sent from the host device 4 to the memory controller 2. The memory interface circuit 25 is coupled to the semiconductor memory device 1 via a memory interface, and manages communications between the memory controller 2 and the semiconductor memory device 1. The memory interface sends, for example, a chip enable signal CEn, a command latch enable signal CLE, an address latch enable signal ALE, a write enable signal WEn, a read enable signal REn, a write protect signal WPn, a ready/busy signal R/Bn, and signals DQ0 to DQ7. The memory interface circuit 25 generates a command set based on, for example, a host command from the host device 4, and sends the command set to the semiconductor memory device 1 via the signals DQ0 to DQ7. The command set contains, for example, a command and address information. The command set may contain data in addition to the command and the address information.

(2) Semiconductor Memory Device

Figure 2:
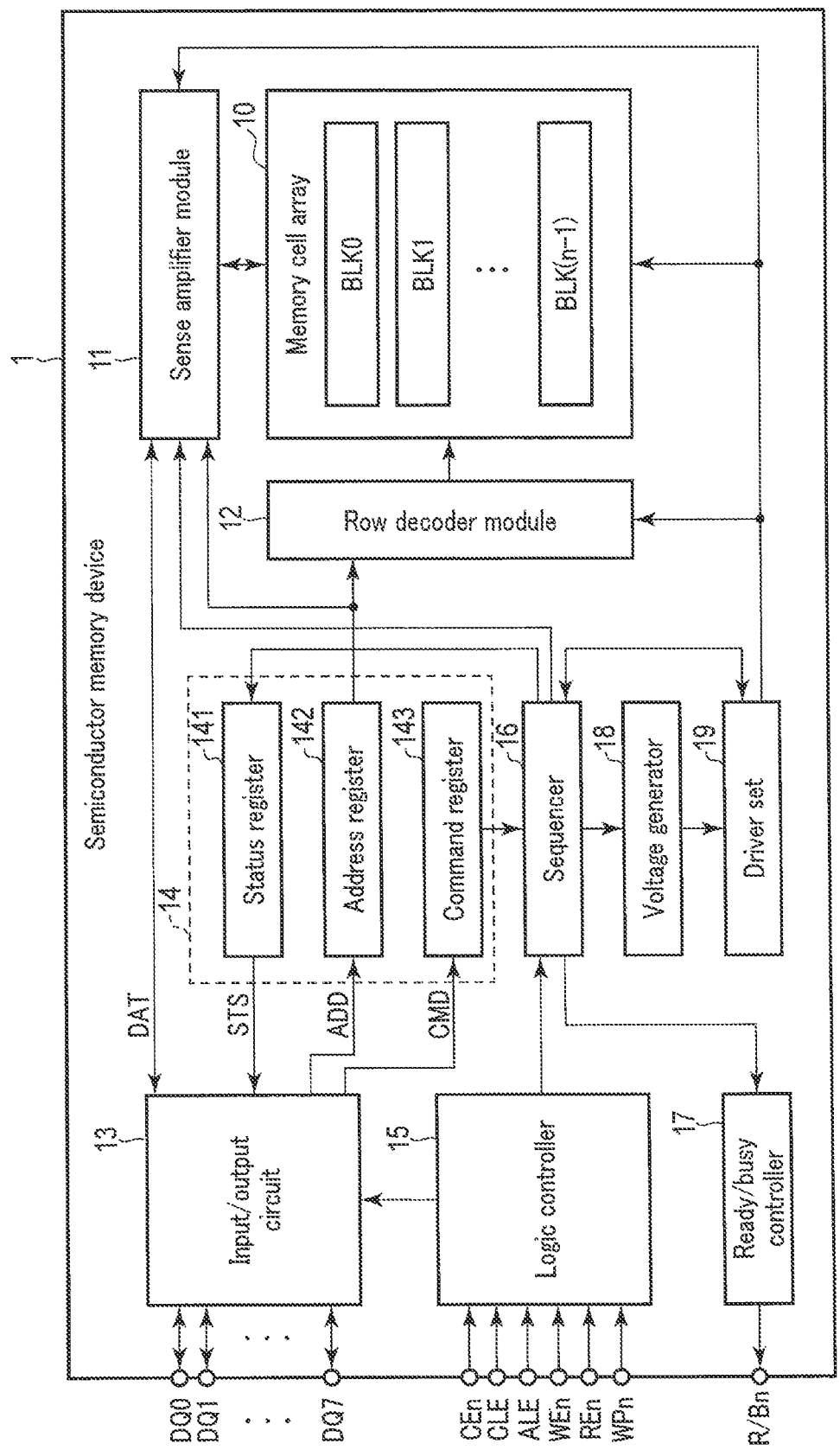
FIG. 2 is a block diagram showing an example of a configuration of the semiconductor memory device according to the first embodiment.

FIG. 2 is a block diagram showing an example of a configuration of the semiconductor memory device 1 according to the first embodiment. The semiconductor memory device 1 according to the first embodiment is, for example, a NAND-type flash memory capable of storing data in a non-volatile manner.

The semiconductor memory device 1 includes a memory cell array 10, a sense amplifier module 11, a row decoder module 12, an input/output circuit 13, a register 14, a logic controller 15, a sequencer 16, a ready/busy controller 17, a voltage generator 18, and a driver set 19. The semiconductor memory device 1 executes various operations, such as a write operation of storing write data into the memory cell array 10, a read operation of reading read data from the memory cell array 10, etc.

The memory cell array 10 includes blocks BLK0 to BLK(n−1) (where n is an integer equal to or greater than 1). The block BLK includes a plurality of non-volatile memory cells each associated with a bit line and a word line, and constitutes, for example, a unit of data erasure. In the semiconductor memory device 1, for example, single-level cell (SLC) technology, multi-level cell (MLC) technology, three-level cell (TLC) technology, or quad-level cell (QLC) technology is applicable. An SLC memory cell stores 1-bit data, an MLC memory cell stores 2-bit data, a TLC memory cell stores 3-bit data, and a QLC memory cell stores 4-bit data. Data of 5 or more bits may be stored in each memory cell.

The input/output circuit 13 controls input/output of the signals DQ0 to DQ7 to and from the memory controller 2. The signals DQ0 to DQ7 contain, for example, a command CMD, data DAT, address information ADD, and status information STS. The command CMD includes, for example, a command for causing the semiconductor memory device 1 to execute a process in response to a host command from the host device 4. The data DAT includes write data or read data (hereinafter, both the write data and the read data will be referred to by a reference sign DAT to simplify the reference.) The address information ADD includes, for example, a column address and a row address. The status information STS contains, for example, information regarding results of a write operation and a read operation executed in the semiconductor memory device 1.

More specifically, the input/output circuit 13 includes an input circuit and an output circuit, and the input circuit and the output circuit perform the following processing. The input circuit receives, from the memory controller 2, write data DAT, address information ADD, and a command CMD. The input circuit transfers the write data DAT to the sense amplifier module 11, and transfers the address information ADD and the command CMD to the register 14. The output circuit receives status information STS from the register 14, and receives read data DAT from the sense amplifier module 11. The output circuit sends the status information STS and the read data DAT to the memory controller 2. Here, the input/output circuit 13 and the sense amplifier module 11 are coupled via a data bus. The data bus includes, for example, eight data lines IO0 to IO7 respectively associated with signals DQ0 to DQ7. The number of the data lines 10 is not limited to eight, and may be set to a given number, such as 16 or 32.

The register 14 includes a status register 141, an address register 142, and a command register 143.

The status register 141 stores status information STS, and transfers the status information STS to the input/output circuit 13 based on an instruction from the sequencer 16.

The address register 142 stores address information ADD transferred from the input/output circuit 13, and transfers the address information ADD to the sequencer 16. The address register 142 transfers the column address in the address information ADD to the sense amplifier module 11, and transfers the row address in the address information ADD to the row decoder module 12.

The command register 143 stores the command CMD transferred from the input/output circuit 13, and transfers the command CMD to the sequencer 16.

The logic controller 15 receives, from the memory controller 2, the chip enable signal CEn, the command latch enable signal CLE, the address latch enable signal ALE, the write enable signal WEn, the read enable signal REn, the write protect signal WPn, for example. The logic controller 15 controls, based on these signals, the input/output circuit 13 and the sequencer 16.

The chip enable signal CEn is used to enable the semiconductor memory device 1. The command latch enable signal CLE is used to notify the input/output circuit 13 of a period during which the command CMD is to be sent via the signals DQ0 to DQ7 input to the semiconductor memory device 1. The address latch enable signal ALE is used to notify the input/output circuit 13 of a period during which the address information ADD is to be sent via the signals DQ0 to DQ7 input to the semiconductor memory device 1. The write enable signal WEn and the read enable signal REn are respectively used to enable input and output of the signals DQ0 to DQ7 by the input/output circuit 13. The write protect signal WPn is used to prohibit data writing and erasure in the semiconductor memory device 1.

The sequencer 16 receives, from the register 14, the command CMD and the address information ADD, and controls the entire operation of the semiconductor memory device 1 in accordance with the command CMD and the address information ADD. The sequencer 16 controls, for example, the sense amplifier module 11, the row decoder module 12, the voltage generator 18, the driver set 19, etc., and executes various operations such as a write operation and a read operation.

The sequencer 16 generates status information STS, and sends the generated status information STS to the status register 141.

The ready/busy controller 17 generates a ready/busy signal R/Bn in accordance with the control by the sequencer 16, and sends a ready/busy signal R/Bn to the memory controller 2. The ready/busy signal R/Bn is used to notify the memory controller 2 of which of a ready state and a busy state the semiconductor memory device 1 is in. In the ready state, the semiconductor memory device 1 accepts a command from the memory controller 2. In the busy state, the semiconductor memory device 1 does not accept a command for causing the semiconductor memory device 1 to, for example, execute an operation involving an access to the memory cell array 10 from the memory controller 2.

The voltage generator 18 generates various voltages based on the control by the sequencer 16, and supplies the generated voltages to the driver set 19.

The driver set 19 generates, for example, various voltages to be applied to word lines WL, a source line SL, and the like in various operations such as a read operation and a write operation, based on the voltages supplied from the voltage generator 18. The driver set 19 transfers the generated voltages to the memory cell array 10, the sense amplifier module 11, the row decoder module 12, and the like.

The sense amplifier module 11 receives a column address from the address register 142, and decodes the column address. The sense amplifier module 11 executes an operation of transferring data DAT between the memory controller 2 and the memory cell array 10 based on the result of the decoding. That is, the sense amplifier module 11 senses a threshold voltage of a memory cell transistor in the memory cell array 10 to generate read data DAT, and outputs the generated read data DAT to the memory controller 2 via the input/output circuit 13. Also, the sense amplifier module 11 receives write data DAT from the memory controller 2 via the input/output circuit 13, and transfers the write data DAT to the memory cell array 10.

The row decoder module 12 receives a row address from the address register 142, and decodes the row address. The row decoder module 12 selects, based on the result of the decoding, a block BLK to be a target of execution of various operations (hereinafter also referred to as a "selected block BLK(sel)"), such as a read operation and a write operation. The row decoder module 12 is capable of transferring voltages supplied from the driver set 19 to the selected block BLK(sel).

(3) Memory Cell Array

Figure 3:
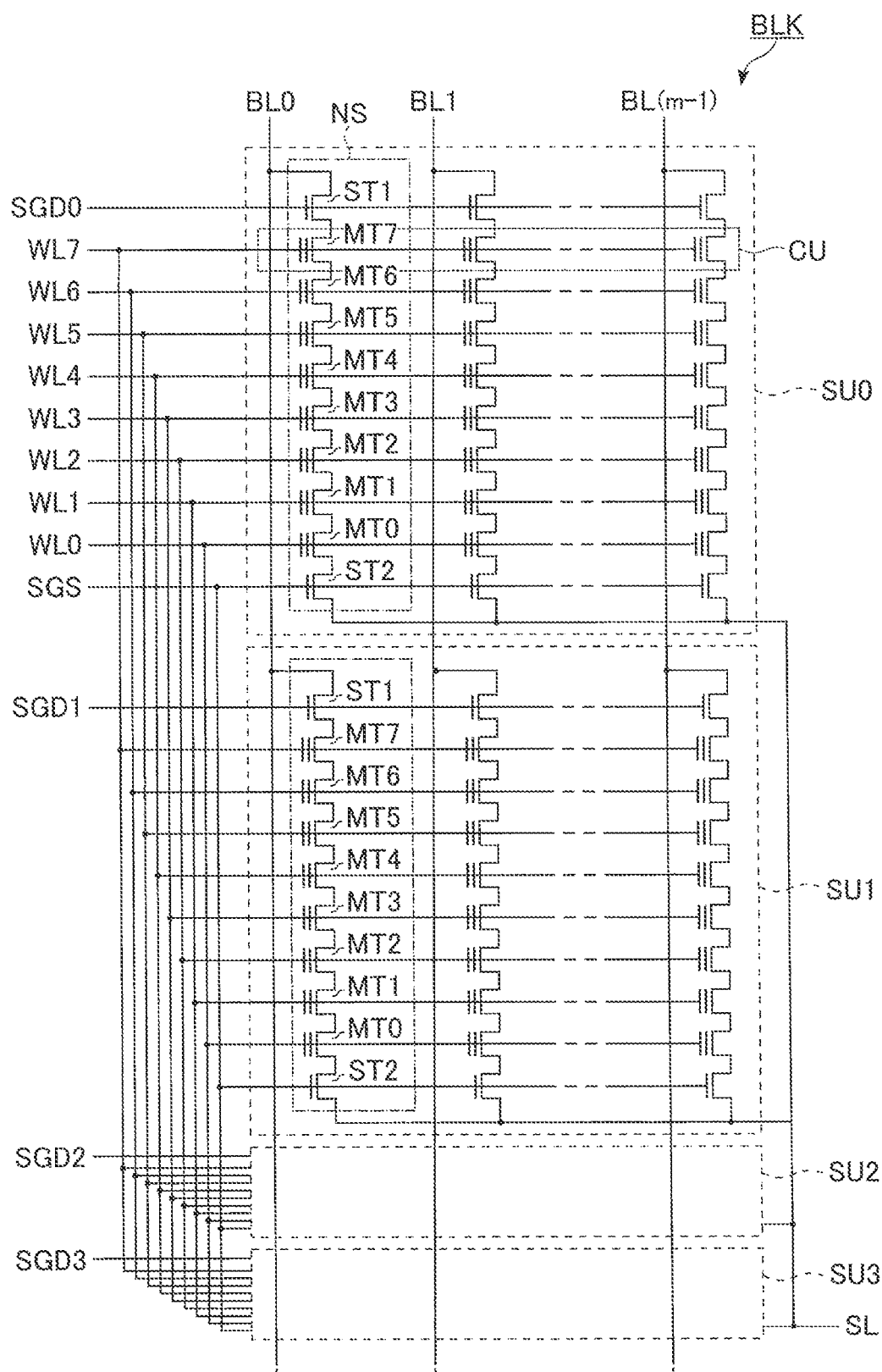
FIG. 3 shows an example of a circuit diagram of a memory cell array of the semiconductor memory device according to the first embodiment.

FIG. 3 shows an example of a circuit diagram of the memory cell array 10 of the semiconductor memory device 1 according to the first embodiment. As an example of a circuit configuration of the memory cell array 10, an example of a circuit configuration of a block BLK included in the memory cell array 10 is shown. Each of the other blocks BLK included in the memory cell array 10 may have a circuit configuration similar to that shown in FIG. 3.

The block BLK includes, for example, four string units SU0 to SU3. Each string unit SU includes a plurality of NAND strings NS. The NAND strings NS are respectively associated with m bit lines BL0 to BL(m−1) (where m is an integer equal to or greater than 1). Each NAND string NS is coupled to a bit line BL associated therewith, and includes, for example, memory cell transistors MT0 to MT7 and select transistors ST1 and ST2. Each memory cell transistor MT includes a control gate (hereinafter referred to as a "gate") and a charge storage layer, and stores data in a non-volatile manner. Each of the select transistors ST1 and ST2 is used for selection of a NAND string NS including the select transistors ST1 and ST2 in various operations.

A drain of the select transistor ST1 of each NAND string NS is coupled to a bit line BL associated with the NAND string NS. The memory cell transistors MT0 to MT7 are coupled in series between a source of the select transistor ST1 and a drain of the select transistor ST2. A source of the select transistor ST2 is coupled to the source line SL. Interconnects coupled to the respective gates of the select transistors ST1 and ST2, and the memory cell transistors MT0 to MT7, will be described using integers j and k.

The description that follows applies to all the cases where j is an integer from 0 to 3 and k is an integer from 0 to 7 in the example of FIG. 3. The gates of the select transistors ST1 of the NAND strings NS included in a string unit SUj are commonly coupled to a select gate line SGDj. The gates of the select transistors ST2 of the NAND strings NS included in the block BLK are commonly coupled to a select gate line SGS. The gates of the memory cell transistors MTk of the NAND strings NS included in the block BLK are commonly coupled to a word line WLk.

Each bit line BL is coupled to the drains of the select transistors ST1 of the corresponding NAND strings NS included in the respective string units SU of the block BLK. The source line SL is shared among the plurality of string units SU. Furthermore, the source line SL may be shared among a plurality of blocks BLK.

A group of memory cell transistors MT commonly coupled to a single word line WL in a single string unit SU is referred to as, for example, a "cell unit CU". For example, a group of same-order items of 1-bit data respectively stored in the memory cell transistors MT in a cell unit CU is referred to as, for example, "1-page data". When, for example, multiple-bit data is stored in each memory cell based on the MLC technology, etc., a single cell unit CU may store a plurality of items of "1-page data".

A circuit configuration of the memory cell array 10 has been described above; however, the circuit configuration of the memory cell array 10 is not limited to the above-described one. For example, the number of string units SU included in each block BLK may be set to a given number. Also, the number of memory cell transistors MT and the number of select transistors ST1 and ST2 included in each NAND string NS can be set to a given number. The numbers of the word lines WL and the select gate lines SGD and SGS are changed based on the number of the memory cell transistors MT and the number of the select transistors ST1 and ST2 in the NAND string NS.

Figure 4:
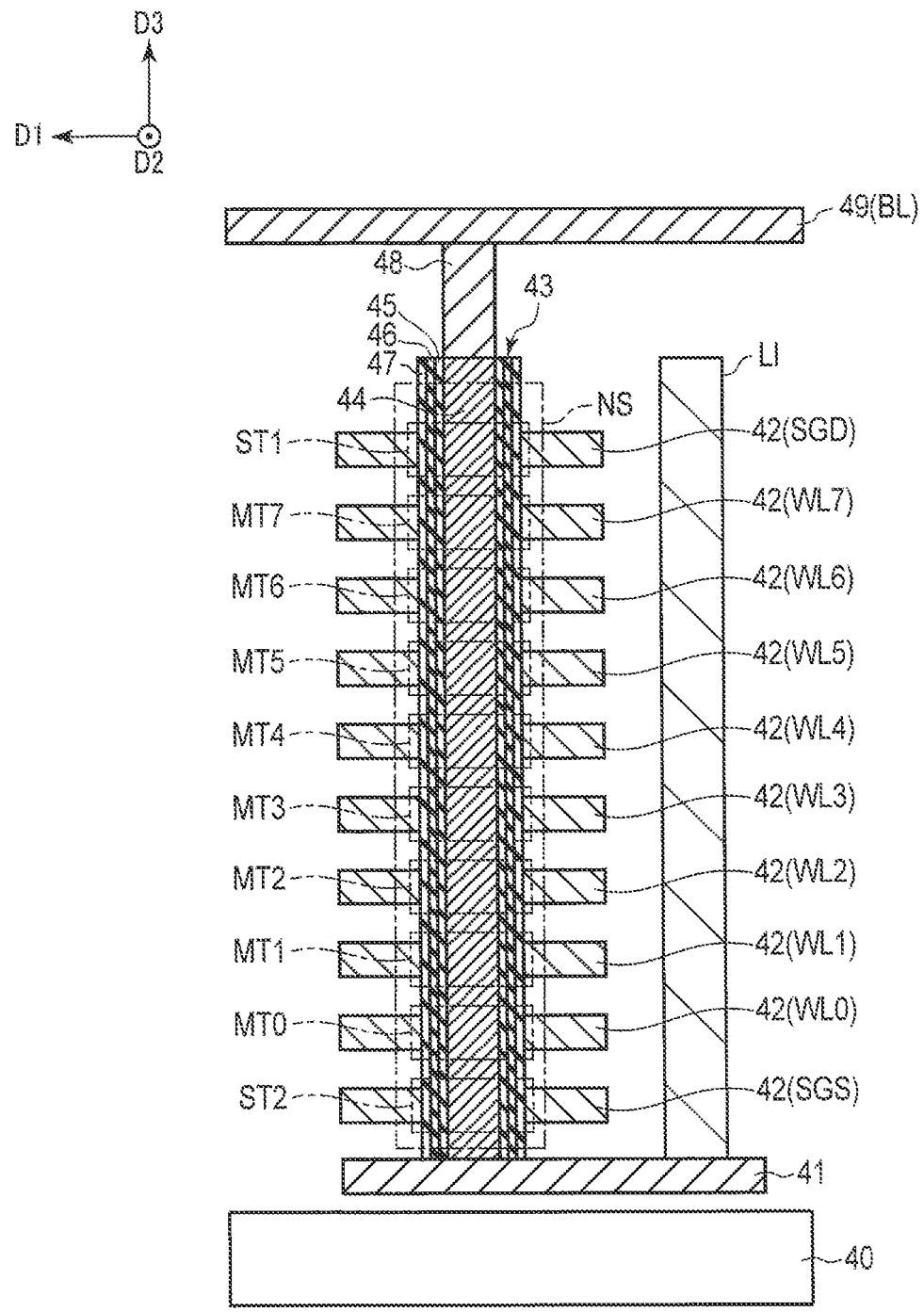
FIG. 4 is a cross-sectional view showing an example of a part of a cross-sectional structure of the memory cell array of the semiconductor memory device according to the first embodiment.

FIG. 4 is a cross-sectional view showing an example of a part of a cross-sectional structure of the memory cell array 10 of the semiconductor memory device 1 according to the first embodiment. In the example of FIG. 4, interlayer insulators are omitted.

A part of the memory cell array 10 is configured by conductors 41, 42, and 49, a memory pillar 43, and a contact plug 48.

The semiconductor memory device 1 includes a semiconductor substrate 40. Here, two directions that are parallel to the plane of the semiconductor substrate 40 and are, for example, orthogonal to each other are defined as a first direction D1 and a second direction D2. A direction which intersects the plane and in which the memory cell array 10 is formed with reference to the plane is defined as a third direction D3. The third direction D3 will be described as being orthogonal to the first direction D1 and the second direction D2; however, the configuration is not necessarily limited thereto. In the description that follows, the third direction D3 will be assumed as an upper side and a direction opposite to the third direction D3 will be assumed as a lower side; however, such assumption is merely for convenience, and is irrelevant to, for example, the direction of gravity.

A conductor 41 is provided above the semiconductor substrate 40 with an insulator interposed therebetween. The conductor 41 functions as the source line SL. A plurality of conductors 42 are sequentially stacked above the conductor 41 with an insulator interposed between adjacent conductors. In FIG. 4, ten conductors 42, for example, are stacked, and the ten conductors 42 respectively function as, from the lower side to the upper side, a select gate line SGS, word lines WL0 to WL7, and a select gate line SGD.

A memory pillar 43 is provided in the conductors 42. The memory pillar 43 extends in, for example, the third direction D3. In the memory pillar 43, on a side surface of a pillar-shaped semiconductor 44, a tunnel insulating layer 45, a charge storage layer 46, and a block insulating layer 47 are sequentially provided. The semiconductor 44 reaches, at its lower end, the conductor 41. A portion of the memory pillar 43 that intersects a single conductor 42 functions as a memory cell transistor MT, a select transistor ST1, or a select transistor ST2. The semiconductor 44 functions as a current path of the NAND string NS, which is a region in which a channel of each memory cell transistor MT is to be formed. An upper end of the semiconductor 44 is coupled to the conductor 49 via the contact plug 48. The conductor 49 extends in, for example, the first direction D1, and functions as a bit line BL. A conductor LI is provided on the conductor 41. The conductor LI extends in, for example, the second direction D2 and the third direction D3, and functions as a source line contact. The conductor LI has, for example, a linear shape extending along the second direction D2. A single string unit SU, for example, is arranged between two conductors LI.

(4) Threshold Voltage Distributions of Memory Cell Transistors

FIG. 5 shows an example of threshold voltage distributions, data allocation, read voltages, and verify voltages in the case where each memory cell transistor MT in the memory cell array 10 shown in FIG. 3 stores 3-bit data.

A description will be given by focusing on the value of the voltage obtained by subtracting the value of the potential of the source of the memory cell transistor MT from the value of the potential of the gate of the memory cell transistor MT (hereinafter also referred to as a "gate-source voltage difference"). By increasing the value of the voltage difference, the memory cell transistor MT is switched from an off state to an on state. The voltage difference at the point in time when the memory cell transistor MT is switched from the off state to the on state is referred to as a threshold voltage of the memory cell transistor MT. The value of the threshold voltage may be a negative value, namely, the threshold voltage may be a minus voltage. The memory cell transistor MT stores the 3-bit data based on the threshold voltage. In a write operation, a program operation is performed in which the threshold voltage of a memory cell transistor MT is increased by ejecting electrons into the charge-storage layer of the memory cell transistor MT.

FIG. 5 shows an example of eight threshold voltage distributions formed as a result of such threshold voltage control, schematically showing an example of a graph in which the number of memory cell transistors MT whose threshold voltages take a particular value is plotted by using that value as a variable. The lateral axis shows the value of a threshold voltage Vth of a memory cell transistor MT. The vertical axis shows the number of memory cell transistors MT.

The eight threshold voltage distributions are respectively associated with, for example, an "Er" state, an "A" state, a "B" state, a "C" state, a "D" state, an "E" state, an "F" state, and a "G" state. The memory cell transistors MT are discriminated as being in one of the Er state, the A state, the B state, the C state, the D state, the E state, the F state, and the G state, according to the threshold voltages of the memory cell transistors MT. The threshold voltages of the memory cell transistors MT increase in the order of the Er state, the A state, the B state, the C state, the D state, the E state, the F state, and the G state. For example, data "111" ("upper bit/middle bit/lower bit") is allocated to the Er state, data "110" is allocated to the A state, data "100" is allocated to the B state, data "000" is allocated to the C state, data "010" is allocated to the D state, data "011" is allocated to the E state, data "001" is allocated to the F state, and data "101" is allocated to the G state. The data allocated to each state is data stored in the memory cell transistor MT in that state.

In a write operation, a verify operation of verifying whether or not the threshold voltage of the memory cell transistor MT has exceeded a predetermined voltage is performed. Verify voltages used in a verify operation are set. Specifically, a verify voltage VVA is set in association with the A state, a verify voltage VVB is set in association with the B state, a verify voltage VVC is set in association with the C state, a verify voltage VVD is set in association with the D state, a verify voltage VVE is set in association with the E state, a verify voltage VVF is set in association with the F state, and a verify voltage VVG is set in association with the G state.

A case will be described where a voltage is applied between a gate and a source of a memory cell transistor MT in such a manner that the gate-source voltage difference becomes the verify voltage VVA. When the memory cell transistor MT is brought into the on state, it can be seen that the memory cell transistor is in the Er state. On the other hand, when the memory cell transistor MT is in the off state, it can be seen that the memory cell transistor MT is in one of the A state, the B state, the C state, the D state, the E state, the F state, and the G state. It is thereby possible to verify, as a result of, for example, a write operation of the data "110", whether or not the threshold voltage of the write-target memory cell transistor MT has fallen into one of the A-state, B-state, C-state, D-state, E-state, F-state, and G-state threshold voltage distributions. The same applies to the other verify voltages.

In a read operation, it is determined which of the states the memory cell transistor MT is in. Read voltages used in a read operation are set. Specifically, a read voltage VRA is set in association with the A state, a read voltage VRB is set in association with the B state, a read voltage VRC is set in association with the C state, a read voltage VRD is set in association with the D state, a read voltage VRE is set in association with the E state, a read voltage VRF is set in association with the F state, and a read voltage VRG is set in association with the G state.

A case will be described where a voltage is applied between a gate and a source of a memory cell transistor MT in such a manner that the gate-source voltage difference becomes the read voltage VRA. When the memory cell transistor MT is brought into the on state, it can be seen that the memory cell transistor MT is in the "Er" state. On the other hand, when the memory cell transistor MT is in the off state, it can be seen that the memory cell transistor MT is in one of the A state, the B state, the C state, the D state, the E state, the F state, and the G state. It is thereby possible to determine whether the memory cell transistor MT is in the Er state or in one of the A state, the B state, the C state, the D state, the E state, the F state, and G state. The same applies to the other read voltages.

Prior to execution of a read operation, there is a case where some of the electrons stored in the charge storage layer of the memory cell transistor MT are dropped from the charge storage layer with the passage of time, causing a decrease in threshold voltage of the memory cell transistor MT. To address such a decrease in threshold voltage, each read voltage is set to be lower than the verify voltage set in association with a state identical to that of the read voltage. That is, the read voltage VRA is lower than the verify voltage VVA, the read voltage VRB is lower than the verify voltage VVB, the read voltage VRC is lower than the verify voltage VVC, the read voltage VRD is lower than the verify voltage VVD, the read voltage VRE is lower than the verify voltage VVE, the read voltage VRF is lower than the verify voltage VVF, and the read voltage VRG is lower than the verify voltage VVG.

Furthermore, a read pass voltage Vread is set so as to be constantly higher than the threshold voltage of the memory cell transistor MT in the G state, which is the highest-voltage state. When a voltage is applied between a gate and a source of a memory cell transistor MT in such a manner that the gate-source voltage difference becomes the read pass voltage Vread, the memory cell transistor MT is brought into the on state, regardless of data stored therein.

The number of bits of data stored in a single memory cell transistor MT and the data allocation to the threshold voltage distributions described above is merely an example, and the configuration is not limited thereto.

(5) Sense Amplifier Module

FIG. 6 is a block diagram showing an example of a configuration of the sense amplifier module 11 of the semiconductor memory device 1 according to the first embodiment. A configuration of the sense amplifier module 11 to be described below is merely an example, and various configurations may be adopted as the sense amplifier module 11.

The sense amplifier module 11 includes, for example, m sense amplifier units SAU0 to SAU(m−1). The m sense amplifier units SAU0 to SAU(m−1) are respectively associated with, for example, m bit lines BL0 to BL(m−1).

Each sense amplifier unit SAU includes, for example, a sense amplifier circuit SA, and latch circuits ADL, BDL, CDL, and XDL. The number of latch circuits included in each sense amplifier unit SAU is, for example, based on the number of bits of data stored in each memory cell transistor MT. A description will be given of the sense amplifier circuit SA and the latch circuits ADL, BDL, CDL, and XDL by focusing on a single sense amplifier unit SAU.

The sense amplifier circuit SA is coupled to a bit line BL associated with the sense amplifier unit SAU. The sense amplifier circuit SA and the latch circuits ADL, BDL, CDL, and XDL are commonly coupled to a bus DBUS.

In a write operation, the sense amplifier circuit SA applies a voltage to the bit line BL. In a read operation, the sense amplifier circuit SA reads data by sensing a threshold voltage of a memory cell transistor MT based on a current flowing through the bit line BL or a potential of the bit line BL. In the read operation, a control signal STB is supplied to the sense amplifier circuit SA by, for example, the sequencer 16. The sense amplifier circuit SA confirms the data at a timing when the control signal STB is asserted, and outputs the data to the bus DBUS.

The latch circuits ADL, BDL, and CDL receive data via the bus DBUS, for example, and temporarily store the received data.

The latch circuit XDL is coupled to a bus XBUS. The latch circuit XDL is coupled to the input/output circuit 13 via the bus XBUS.

The latch circuit XDL allows data to be sent and received between the sense amplifier unit SAU and the input/output circuit 13. In a write operation, a bit of data received by the semiconductor memory device 1 from the memory controller 2 is stored in the latch circuit XDL, and then transferred to the latch circuits ADL, BDL, and CDL, or the sense amplifier circuit SA. In a read operation, data in the latch circuits ADL, BDL, and CDL, or data in the sense amplifier circuit SA is transferred to the latch circuit XDL and stored therein, and then transferred to the input/output circuit 13 and output to the outside of the semiconductor memory device 1. Thus, the latch circuit XDL functions as a cache memory of the semiconductor memory device 1 coupled in series between the input/output circuit 13 and the sense amplifier circuit SA.

(6) Driver Set

FIG. 7 shows an example of a configuration of the driver set 19 of the semiconductor memory device 1 according to the first embodiment. A configuration of the driver set 19 to be described below is merely an example, and various configurations may be adopted as the driver set 19.

The driver set 19 includes a driver DRV. The driver DRV generates, for example, a voltage based on a voltage supplied from the voltage generator 18, etc., and outputs the generated voltage at its output end. The output voltage is transferred by the driver set 19 to a node NCG1.

The row decoder module 12 electrically couples, based on a row address, the node NCG1 and a word line WL. The word line WL is, for example, a word line WL coupled to a memory cell transistor MT to be a write target or a read target of the selected block BLK(sel) (hereinafter also referred to as a "selected memory cell transistor MT"). The word line WL coupled to the selected memory cell transistor MT will be hereinafter referred to as a "selected word line WL(sel)". The row decoder module 12 allows the voltage output from the driver DRV to be transferred from the node NCG1 to the selected word line WL(sel) through the electrical coupling.

A configuration of the driver set 19 will be described in more detail below. A part or the entirety of the configuration described as being included in the driver set 19 may be provided in, for example, another part of semiconductor memory device 1, such as the sequencer 16.

The driver set 19 includes, for example, a switch SWb, a resistance RL, and a leakage detection circuit LDC.

An output end of the driver DRV is coupled to a node NCG2. A first end of the switch SWb is coupled to the node NCG2, and a second end of the switch SWb is coupled to the node NCG1. One end of the resistance RL is coupled to the node NCG2, and another end of the resistance RL is coupled to the node NCG1.

The switch SWb is, for example, a switching element between two terminals, and allows a signal to be transmitted between the first end and the second end while the switch SWb is in the on state. The switch SWb is, for example, a field-effect transistor (FET) such as an n-channel metal-oxide semiconductor (MOS) transistor. Herein, a description will be given based on the assumption that the switch SWb is an n-channel MOS transistor. Unless otherwise particularly mentioned, the same applies to the other switches SW.

A control signal is input to a control gate (hereinafter also referred to as a "gate" or a "control end") of the switch SWb. The control signal is, for example, supplied by the sequencer 16. The switch SWb is, for example, in the off state while the control signal is at a low (L) level, and is in the on state while the control signal is at a high (H) level. Unless otherwise particularly mentioned, the same applies to the other switches SW. Hereinafter, the term "level" refers to a level of a voltage, unless otherwise particularly mentioned.

The leakage detection circuit LDC is coupled to the nodes NCG1 and NCG2. The leakage detection circuit LDC performs, based on a potential (hereinafter, a potential will also be referred to as a "voltage") Vcg1 of the node NCG1 and a voltage Vcg2 of the node NCG2, a process of detecting a leakage current of the selected word line WL(sel) (hereinafter also referred to as a leakage detection process). The leakage detection circuit LDC may perform, as a leakage detection process, either a process of detecting a leakage current that flows into the selected word line WL(sel) or a process of detecting a leakage current that flows out from the selected word line WL(sel). The leakage detection circuit LDC outputs a signal FLG indicating whether a leakage current has been detected. The signal FLG is, for example, sent to the sequencer 16. In the example of FIG. 4, a leakage current may occur, for example, between a conductor 42 which functions as a selected word line WL(sel) and a conductor 42 which is insulated from the conductor 42 but is physically close to the conductor 42 and functions as another word line WL. Furthermore, in the example of FIG. 4, a leakage current may occur between the conductor 42 which functions as a selected word line WL(sel) and a conductor LI which is insulated from the conductor 42 but is physically close to the conductor 42 and functions as a source line contact.

For example, the switch SWb is brought into the off state during a period of a leakage detection process by the leakage detection circuit LDC, and the switch SWb is brought into the on state in the other periods. In the on state, the switch SWb transmits a voltage output from the driver DRV to the node NCG2 to which its first end is coupled, to the node NCG1 to which its second end is coupled. Thereby, the above-described transfer by the driver set 19 of the voltage output from the driver DRV to the node NCG1 is realized.

The leakage detection circuit LDC includes, for example, switches SW1, SW2, SW3, and SW4, capacitance elements (also referred to as capacitors) C1 and C2, an amplifier circuit AMP, and a comparator CMP.

First, a coupling relationship of such components included in the leakage detection circuit LDC will be described.

A first end of the switch SW1 is coupled to the node NCG1, and a second end of the switch SW1 is coupled to a node N1. A control signal is input to a gate of the switch SW1. The control signal is, for example, supplied by the sequencer 16. Through the coupling of the first end of the switch SW1 and the node NCG1, the above-described coupling between the leakage detection circuit LDC and the node NCG1 is realized.

A first end of the switch SW2 is coupled to the node NCG2, and a second end of the switch SW2 is coupled to the node N1. A control signal is input to a gate of the switch SW2. The control signal is, for example, supplied by the sequencer 16. Through the coupling between the first end of the switch SW2 and the node NCG2, the above-described coupling between the leakage detection circuit LDC and the node NCG2 is realized.

A first electrode of the capacitance element C1 is coupled to the node N1, and a second electrode of the capacitance element C1 is coupled to a node N2.

A first end of the switch SW3 is coupled to the node N2, and a voltage VBIAS is applied to a second end of the switch SW3. The voltage VBIAS is, for example, a substantially constant reference voltage. A control signal is input to a gate of the switch SW3. The control signal is, for example, supplied by the sequencer 16.

An input end of the amplifier circuit AMP is coupled to the node N2, and the voltage VBIAS is applied to a reference voltage end of the amplifier circuit AMP. An output end of the amplifier circuit AMP is coupled to a node N3.

A first electrode of the capacitance element C2 is coupled to the node N3, and a second electrode of the capacitance element C2 is coupled to a node N4.

A first end of the switch SW4 is coupled to the node N4, and a second end of the switch SW4 is, for example, grounded. A description will be given below based on the assumption that the second end of the switch SW4 is grounded, and therefore a voltage of 0 volts (V) is applied to the second end. A control signal is input to a gate of the switch SW4. The control signal is, for example, supplied by the sequencer 16. Each component described herein as being grounded need not necessarily be grounded, and may be at, for example, the lowest reference potential of reference potentials used in the circuit including the component. A node coupled to a component to allow the component to be at a reference potential is referred to as a "reference potential node". When a reference voltage is applied to a component, the component may be referred to as being coupled to the reference potential node.

A first input end of the comparator CMP is coupled to the node N4, and a voltage VREF is applied to a second input end of the comparator CMP. The voltage VREF is, for example, a substantially constant reference voltage. The voltage VREF is, for example, lower than 0 V. A description will be given below based on the assumption that the voltage VREF is lower than 0 V.

Next, a further description will be given of each component included in the leakage detection circuit LDC.

While, for example, the switch SW1 is in the on state and the switch SW2 is in the off state, a signal can be transmitted between the first end and the second end of the switch SW1, and the switch SW1 transmits the voltage Vcg1 of the node NCG1 coupled to the first end to the node N1 coupled to the second end. On the other hand, while, for example, the switch SW1 is in the off state and the switch SW2 is in the on state, a signal can be transmitted between the first end and the second end of the switch SW2, and the switch SW2 transmits the voltage Vcg2 of the node NCG2 coupled to the first end to the node N1 coupled to the second end.

In this manner, the switch SW1 and the switch SW2 are capable of selectively transferring one of the voltages Vcg1 and Vcg2 to the node N1. If a leakage current exists in the selected word line WL(sel), the leakage current flows between the node NCG1 and the node NCG2 via the resistance RL while the switch SWb is in the off state and at least one of the switches SW1 and SW2 is in the off state. This causes a voltage drop in the resistance RL, thus making the voltages Vcg1 and Vcg2 differ. By sequentially transferring the voltages Vcg1 and Vcg2 that are different from each other to the node N1 as described above, the switches SW1 and SW2 are capable of changing a voltage Vn1 of the node N1 between the voltages Vcg1 and Vcg2. The switches SW1 and SW2 change the voltage Vn1, for example, from the voltage Vcg1 or Vcg2, whichever is higher, to the voltage Vcg1 or Vcg2, whichever is lower.

While the switch SW3 is in the on state, a signal can be transmitted between the first end and the second end of the switch SW3, and the switch SW3 transmits the voltage VBIAS applied to the second end to the node N2 coupled to the first end. In this manner, the switch SW3 is capable of fixing a voltage Vn2 of the node N2 at the voltage VBIAS. On the other hand, while the switch SW3 is in the off state, the capacitance element C1 stores a potential difference between the first electrode and the second electrode of the capacitance element C1 when the switch SW3 is brought into the off state. When, for example, the voltage Vn1 changes while the switch SW3 is in the off state, the capacitance element C1 stores a potential difference between the first electrode and the second electrode, and the voltage Vn2 changes by substantially the same amount as the amount of change of the voltage Vn1. In this manner, the capacitance element C1 can transmit the change of the voltage Vn1 to the node N2 as a change of the voltage Vn2.

The amplifier circuit AMP amplifies the voltage Vn2 of the node N2 coupled to the input end of the amplifier circuit AMP with reference to the voltage VBIAS applied to the reference voltage end of the amplifier circuit AMP, and outputs a signal obtained as a result of the amplification to the node N3 coupled to the output end of the amplifier circuit AMP. Hereinafter, a description will be given based on the assumption that the magnification of the amplification is 10 times; however, the magnification of the amplification is not necessarily limited thereto.

When the voltage Vn2 changes, the amplifier circuit AMP outputs a signal obtained as a result of amplifying the voltage Vn2 with reference to the voltage VBIAS to the node N3, and a voltage Vn3 of the node N3 changes by an amount substantially equal to that of the amount of change of the voltage Vn2, namely, 10 times. In this manner, the amplifier circuit AMP amplifies the change of the voltage Vn2 and transmits it to the node N3 as a change of the voltage Vn3.

While the switch SW4 is in the on state, a signal can be transmitted between the first end and the second end of the switch SW4, and the switch SW4 transmits a voltage of 0 V applied to the second end to the node N4 coupled to the first end. In this manner, the switch SW4 is capable of fixing a voltage Vn4 of the node N4 at a voltage of 0 V. On the other hand, while the switch SW4 is in the off state, the capacitance element C2 stores a potential difference between the first electrode and the second electrode of the capacitance element C2 when the switch SW4 is brought into the off state. When, for example, the voltage Vn3 changes while the switch SW4 is in the off state, the capacitance element C2 stores a potential difference between the first electrode and the second electrode, and the voltage Vn4 changes by substantially the same amount as the amount of change of the voltage Vn3. In this manner, the capacitance element C2 can transmit the change of the voltage Vn3 to the node N4 as a change of the voltage Vn4.

The comparator CMP outputs a signal obtained as a result of comparison between the voltage Vn4 of the node N4 coupled to its first input end and the voltage VREF applied to its second input end. Such a signal is the signal FLG. The level of the signal FLG differs according to whether or not the voltage Vn4 falls below the voltage VREF.

When the voltage Vn4 changes and falls below the voltage VREF, the level of the signal FLG output from the comparator CMP changes. The change in the level of the signal FLG may mean that a leakage current has been detected.

The control signals described as being input to the gates of the switches SWb, SW1, SW2, SW3, and SW4 can be, for example, independently controlled by the sequencer 16.

In the foregoing, an example of a circuit configuration of the leakage detection circuit LDC has been described. However, the circuit configuration of the leakage detection circuit LDC according to the present embodiment is not limited to the above-described one. For example, the leakage detection circuit LDC may have a configuration in which the switch SW3, the amplifier circuit AMP, and the capacitance element C2 are not included, and the first input end of the comparator CMP and the first end of the switch SW4 are coupled to the node N2. The leakage detection circuit LDC may have another configuration capable of, for example, detecting a leakage current based on a change in the above-described voltage Vn1.

The description has been given above based on the assumption that the driver set 19 includes the switch SWb. However, the driver set 19 need not necessarily include the switch SWb, and therefore, the switch SWb need not be provided between the node NCG1 and the node NCG2.

Operation Example

Hereinafter, an operation example of performing a leakage detection operation subsequent to a verify operation by the semiconductor memory device 1 will be described in detail. A leakage detection operation refers to an operation of causing the leakage detection circuit LDC to perform a leakage detection process, unless otherwise particularly mentioned.

(1) Overview of Verify Operation and Leakage Detection Operation

Figure 8:
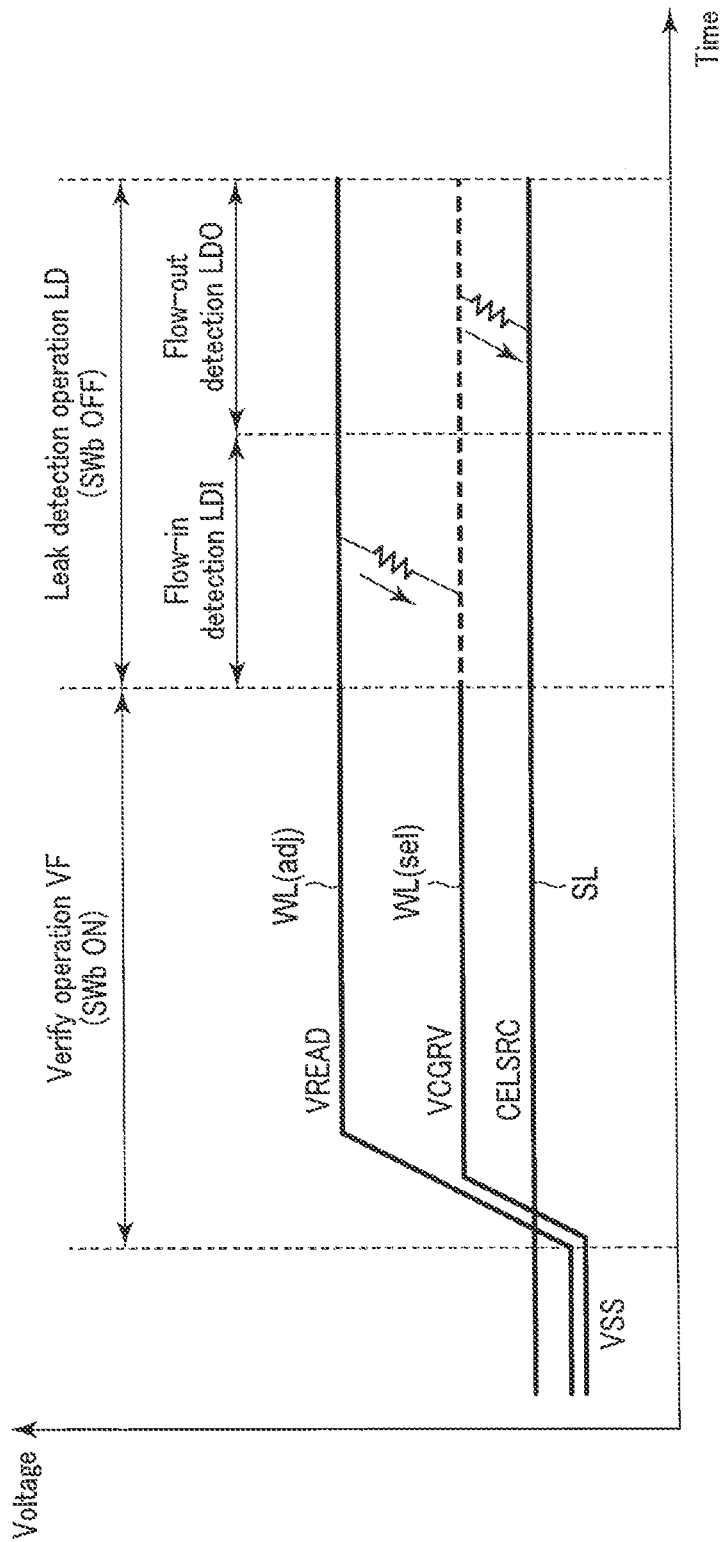
FIG. 8 shows an example of a timing chart showing temporal changes of voltages applied to various interconnects at the time of execution of a leakage detection operation subsequent to a verify operation by the semiconductor memory device according to the first embodiment.

FIG. 8 shows an example of a timing chart showing temporal changes of voltages applied to various interconnects at the time of execution of a leakage detection operation LD subsequent to a verify operation VF by the semiconductor memory device 1 according to the first embodiment. The verify operation and the leakage detection operation to be described below are merely an example, and the verify operation and the leakage detection operation according to the present embodiment are not limited thereto. In the description that follows, when a voltage to be applied to an interconnect is described, it is assumed that the application of the voltage to the interconnect is continued unless an explicit description is given later regarding another voltage being applied to the interconnect.

In the timing chart of FIG. 8, a voltage applied to another word line WL coupled to memory cell transistors MT of the selected block BLK(sel) is also shown, in addition to the voltage applied to the selected word line WL(sel). Such a word line WL is referred to as a word line WL(adj), i.e., a word line WL positioned adjacent to, namely, closest to the selected word line WL(sel). Hereinafter, when a voltage applied to the word line WL(adj) is described, voltages applied to other word lines WL coupled to memory cell transistors MT of the selected block BLK(sel) may be controlled similarly to the voltage applied to the word line WL(adj).

Application of voltages to the word lines WL in the description that follows is realized by, for example, the control by the sequencer 16 of the voltage generator 18, the driver set 19, and the row decoder module 12. The application of a voltage to the source line SL is realized by, for example, the control by the sequencer 16 of the voltage generator 18 and the driver set 19. Whether the switch SWb is in the on state or the off state is controlled by, for example, the sequencer 16.

In the example of FIG. 8, prior to the start of a verify operation VF, the switch SWb is in the on state, a voltage VSS is applied to each of the selected word line WL(sel) and the word line WL(adj), and a voltage CELSRC is applied to the source line SL, for example. The voltage VSS is a reference voltage. The voltage VSS may be a voltage of 0 V. The voltage CELSRC is another reference voltage. The voltage VSS is, for example, lower than the voltage CELSRC.

The semiconductor memory device 1 performs a verify operation VF. While the verify operation VF is performed, the switch SWb is controlled so as to be in the on state, for example. A description will be given of voltages applied to interconnects during the verify operation VF.

First, the voltage applied to the selected word line WL(sel) is changed from the voltage VSS to a voltage VCGRV, and the voltage applied to the word line WL(adj) is changed from the voltage VSS to a voltage VREAD. The application of the voltage VCGRV to the selected word line WL(sel), the application of the voltage VREAD to the word line WL(adj), and the application of the voltage CELSRC to the source line SL are continued until completion of the verify operation VF.

The voltages VCGRV and VREAD will be described. The voltage VCGRV is associated with one of the A state, the B state, the C state, the D state, the E state, the F state, and the G state. The value obtained by subtracting the value of the voltage CELSRC from the value of the voltage VCGRV associated with one of the states is, for example, the value of one of the verify voltages VVA, VVB, VVC, VVD, VVE, VVF, and VVG, described with reference to FIG. 5, set in association with that state. The value obtained by subtracting the value of the voltage CELSRC from the value of the voltage VREAD is, for example, the value of the voltage Vread described with reference to FIG. 5. Accordingly, the voltage VREAD is higher than the voltage VCGRV. FIG. 8 shows an example in which the voltage VCGRV is higher than the voltage CELSRC. Hereinafter, a case will be described where the voltage VCGRV is higher than the voltage CELSRC.

In the verify operation VF, the memory cell transistors MT coupled to the word line WL to which the voltage VREAD is applied is set to the on state. Accordingly, whether or not each memory cell transistor MT coupled to the selected word line WL(sel) to which the voltage VCGRV is applied has been brought into the on state may be reflected in the bit line BL to which the memory cell transistor MT is coupled.

The semiconductor memory device 1 performs a leakage detection operation LD subsequent to the verify operation VF. While the leakage detection operation LD is performed, the switch SWb is controlled, for example, to be in the off state. In the leakage detection operation LD, for example, a flow-in detection operation LDI is performed, and then a flow-out detection operation LDO is performed. Herein, a flow-in detection operation refers to an operation of causing the leakage detection circuit LDC to perform a process of detecting a leakage current flowing into the selected word line WL(sel), and a flow-out detection operation refers to a process of causing the leakage detection circuit LDC to perform a process of detecting a leakage current flowing out from the selected word line WL(sel), unless otherwise particularly mentioned.

A description will be given of voltages applied to interconnects during the flow-in detection operation LDI.

During execution of the verify operation VF, since the voltage output from the driver DRV to the node NCG2 is maintained at the voltage VCGRV, the application of the voltage VCGRV to the selected word line WL(sel) is continued. During execution of the flow-in detection operation LDI as well, the voltage output from the driver DRV is maintained at the voltage VCGRV. The same applies to the application of the voltage VREAD to the word line WL(adj) and the application of the voltage CELSRC to the source line SL. That is, the application of the voltage VREAD to the word line WL(adj) and the application of the voltage CELSRC to the source line SL are continued during execution of the flow-in detection operation LDI.

In the flow-in detection operation LDI, a leakage current that flows into the selected word line WL(sel) may be detected. The leakage current is based on, for example, a leakage current that flows into the selected word line WL(sel) from the word line WL(adj). This is because, in the example of FIG. 4, the conductor 42 which functions as a word line WL(adj) is positioned close to the conductor 42 which functions as the selected word line WL(sel), and the voltage VREAD applied to the word line WL(adj) is higher than the voltage applied to the selected word line WL(sel). In FIG. 8, a leakage current flowing between two interconnects that are insulated from each other is schematically shown in the form of a circuit symbol representing a resistance and an arrow, which are placed between the waveforms of the two interconnects.

Next, a description will be given of voltages applied to interconnects during the flow-out detection operation LDO. The flow-out detection operation LDO is performed, for example, when a leakage current is not detected by the flow-in detection operation LDI, and need not be performed when a leakage current is detected by the flow-in detection operation LDI.

During execution of the flow-out detection operation LDO, the voltage output from the driver DRV to the node NCG2 and transferred to the selected word line WL(sel) is maintained at the voltage VCGRV. The same applies to the application of the voltage VREAD to the word line WL(adj) and the application of the voltage CELSRC to the source line SL. That is, the application of the voltage VREAD to the word line WL(adj), and the application of the voltage CELSRC to the source line SL are continued during execution of the flow-out detection operation LDO.

In the flow-out detection operation LDO, a leakage current that flows out from the selected word line WL(sel) may be detected. The leakage current is based on a leakage current that flows out from the selected word line WL(sel) to, for example, the source line SL. This is because, in the example of FIG. 4, the conductor LI which functions as a source line contact is positioned close to the conductor 42 which functions as the selected word line WL(sel), and the voltage applied to the selected word line WL(sel) is higher than the voltage CELSRC applied to the source line SL.

In the foregoing, a description has been given of the case where, as an example of a leakage detection operation, a flow-in detection operation LDI is performed, and then a flow-out detection operation LDO is performed. However, the present embodiment is not limited thereto. In a leakage detection operation, a flow-out detection operation may be performed, and then a flow-in detection operation may be performed. The flow-in detection operation need not be performed when a leakage current is detected by the flow-out detection operation.

Moreover, regardless of whether or not a leakage current is detected by a flow-in detection operation or a flow-out detection operation, a leakage detection operation may be configured to perform only one of a flow-in detection operation and a flow-out detection operation.

Furthermore, a case has been described above where a leakage detection operation LD is performed subsequent to a verify operation VF; however, a leakage detection operation is not limited to one that is performed subsequent to a verify operation.

(2) Details of Flow-in Detection Operation

Hereinafter, details of a flow-in detection operation will be described.

Figure 9:
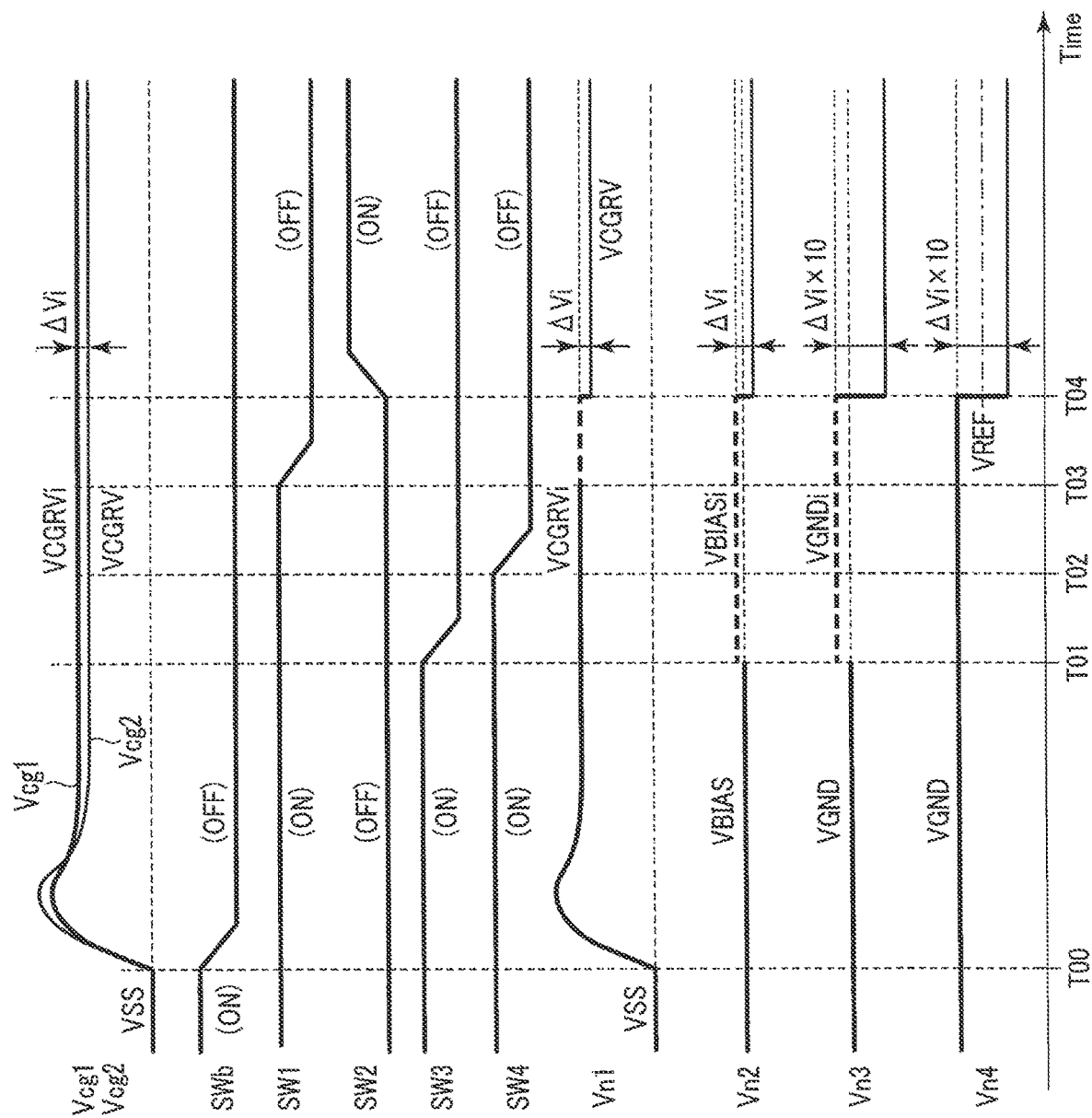
FIG. 9 shows an example of a timing chart showing temporal changes of various voltages at the time of execution of a flow-in detection operation by the semiconductor memory device according to the first embodiment.

FIG. 9 shows an example of a timing chart showing temporal changes of various voltages shown in FIG. 7 at the time of execution of a flow-in detection operation by the semiconductor memory device 1 according to the first embodiment. FIG. 9 shows temporal changes of voltages of control signals that are respectively input to some of the switches SW. In the description that follows, when a level of a control signal is described, it is assumed that the control signal is maintained at that level unless an explicit description is given later regarding the level of the control signal being changed. The level of each control signal is controlled, for example, by the sequencer 16.

Even though the timing chart shown in FIG. 9 is independent of the timing chart shown in FIG. 8, reference is also made to the example of FIG. 8 in the description that follows, which will be given with reference to FIG. 9.

Prior to the start of a flow-in detection operation in the example of FIG. 9, for example, an H-level control signal is input to a gate of the switch SWb to bring the switch SWb to the on state, and the voltage VSS is applied to each of the nodes NCG1 and NCG2. This allows the voltages Vcg1 and Vcg2 to be stabilized at the voltage VSS. An H-level control signal is input to a gate of the switch SW1, bringing the switch SW1 to the on state. An L-level control signal is input to a gate of the switch SW2, bringing the switch SW2 to the off state. Since the switch SW1 is in the on state and the switch SW2 is in the off state, the switch SW1 in the on state transmits the voltage Vcg1 to the node N1. Thereby, the voltage Vn1 is stabilized at the voltage VSS. An H-level control signal is input to a gate of the switch SW3, bringing the switch SW3 to the on state. The switch SW3 in the on state transmits the voltage VBIAS to the node N2. Thereby, the voltage Vn2 is stabilized at the voltage VBIAS. Since the amplifier circuit AMP outputs a signal obtained as a result of amplification of the voltage Vn2 with reference to the voltage VBIAS to the node N3, the voltage Vn3 is 0 V, and is shown as a voltage VGND in FIG. 9. An H-level control signal is input to a gate of the switch SW4, bringing the switch SW4 to the on state. The switch SW4 in the on state transmits the voltage VGND to the node N4. Thereby, the voltage Vn4 is stabilized at the voltage VGND.

From time T00 to completion of the flow-in detection operation, an L-level control signal is input to the gate of the switch SWb, bringing the switch SWb to the off state.

At time T00, control for causing the voltage to be output by the driver DRV to the node NCG2 coupled to the selected word line WL(sel) from the voltage VSS to the voltage VCGRV is started. Such control will be described in more detail below. In the example of FIG. 9, the driver DRV is controlled so as to output the voltage VCGRV after a voltage higher than the voltage VCGRV is output to the node NCG2. As a result, the voltage Vcg2 is stabilized at the voltage VCGRV. The output of the voltage higher than the voltage VCGRV is for the purpose of, for example, reducing the time taken until the voltage Vcg2 is stabilized at the voltage VCGRV. Hereinafter, a case will be described where the driver DRV outputs a voltage VCGRV; however, the voltage output by the driver DRV is not limited to the voltage VCGRV.

The voltage output by the driver DRV to the node NCG2 is transmitted to the node NCG1 electrically coupled to the node NCG2, and as a result, the voltage Vcg1 is stabilized at a voltage VCGRVi. Here, a case will be described where a leakage current flows into the selected word line WL(sel). The leakage current flows into, for example, the node NCG2 from the node NCG1 via the resistance RL, thus causing a voltage drop in the resistance RL due to the leakage current. In this case, the voltage VCGRVi is higher than the voltage VCGRV as a result of the voltage drop. FIG. 9 shows a voltage difference "ΔVi" between the voltage VCGRVi and the voltage VCGRV.

The level of the control signal input to the gate of each of the switches SW1, SW2, SW3, and SW4 is maintained. Since the voltage Vcg1 that the switch SW1 in the on state transmits to the node N1 changes at and after time T00, the voltage Vn1 changes in accordance with changes in the voltage Vcg1, and is stabilized at the voltage VCGRVi, similarly to the voltage Vcg1. The switches SW3 and SW4 in the on state maintain the voltages Vn2, Vn3, and Vn4 before and after time T00.

At time T00, the voltage applied to the word line WL(adj) may be changed from the voltage VSS to the voltage VREAD, and the voltage applied to the source line SL may be changed from the voltage VSS to the voltage CELSRC, even though such a configuration is omitted in FIG. 9.

A case where a flow-in detection operation is started subsequent to a verify operation, as described with reference to FIG. 8, will be described. The increase of each of the voltages Vcg1, Vcg2, and Vn1 from the voltage VSS described above will be omitted. More specifically, when the switch SWb is switched from the on state to the off state at the start of a flow-in detection operation, the voltage Vcg2 is maintained at the voltage VCGRV, and the voltages Vcg1 and Vn1 change from the voltage VCGRV to the voltage VCGRVi and become stabilized. Other than this, the description given above as well as a description to be given below with reference to FIG. 9 apply.

Subsequently, at time T01, the level of the control signal input to the gate of the switch SW3 is changed from the H level to the L level, causing the switch SW3 to be switched from the on state to the off state. In accordance with the switching of the switch SW3 to the off state, the voltage Vn2 changes and is stabilized at a voltage VBIASi, for example. In accordance with the change of the voltage Vn2, the voltage Vn3 changes and is stabilized at a voltage VGNDi. A voltage difference between the voltage VGNDi and the voltage VGND is, for example, 10 times greater than the voltage difference between the voltage VBIASi and the voltage VBIAS, due to the amplification by the amplifier circuit AMP. By the switching of the switch SW3 to the off state, the fixing of the voltage Vn2 at the voltage VBIAS is released, and when the voltage Vn1 changes, the voltages Vn2 and Vn3 may be affected by such a change.

Subsequently, at time T02, the level of the control signal input to the gate of the switch SW4 is changed from the H level to the L level, causing the switch SW4 to be switched from the on state to the off state. By the switching of the switch SW4 to the off state, the fixing of the voltage Vn4 at the voltage VGND is released, and when the voltage Vn3 changes, the voltage Vn4 may be affected by such a change.

Subsequently, at time T03, the level of the control signal input to the gate of the switch SW1 is changed from the H level to the L level, causing the switch SW1 to be switched from the on state to the off state.

Subsequently, at time T04, the level of the control signal input to the gate of the switch SW2 is changed from the L level to the H level, causing the switch SW2 to be switched from the off state to the on state. Since the switch SW1 is in the off state and the switch SW2 is in the on state, the switch SW2 in the on state transmits the voltage Vcg2 to the node N1. Thereby, the voltage Vn1 is stabilized at the voltage VCGRV, similarly to the voltage Vcg2. In this manner, the voltage Vn1 decreases from the voltage VCGRVi by the voltage difference ΔVi.

In accordance with the decrease of the voltage Vn1 by the voltage difference ΔVi, the voltage Vn2 decreases by the voltage difference ΔVi from the voltage VBIASi, similarly to the change in the voltage Vn1. This is because the capacitance element C1 stores a potential difference between the first electrode and the second electrode of the capacitance element C1 when the switch SW3 is brought into the off state.

In accordance with the decrease of the voltage Vn2 by the voltage difference ΔVi, the voltage Vn3 decreases from the voltage VGNDi. The amount of change of the voltage Vn3 is 10 times greater than the voltage difference ΔVi, which is an amount of change of the voltage Vn2. This is because the amplifier circuit AMP outputs a signal obtained as a result of amplification of the voltage Vn2 with reference to the voltage VBIAS to the node N3.

In accordance with the decrease of the voltage Vn3 by 10 times the voltage difference ΔVi, the voltage Vn4 decreases from the voltage VGND by 10 times the voltage difference ΔVi, similarly to the change in the voltage Vn3. This is because the capacitance element C2 stores a potential difference between the first electrode and the second electrode of the capacitance element C2 when the switch SW4 is brought into the off state.

The comparator CMP outputs the signal FLG obtained as a result of comparison between the voltage Vn4 and the voltage VREF. As a result of the change of the voltage Vn4 at time T04, when the voltage Vn4 falls below the voltage VREF, as shown in FIG. 9, the level of the signal FLG output from the comparator CMP changes. The change in the level of the signal FLG means that a leakage current flowing into the selected word line WL(sel) has been detected.

(3) Details of Flow-Out Detection Operation

Hereinafter, details of a flow-out detection operation will be described.

Figure 10:
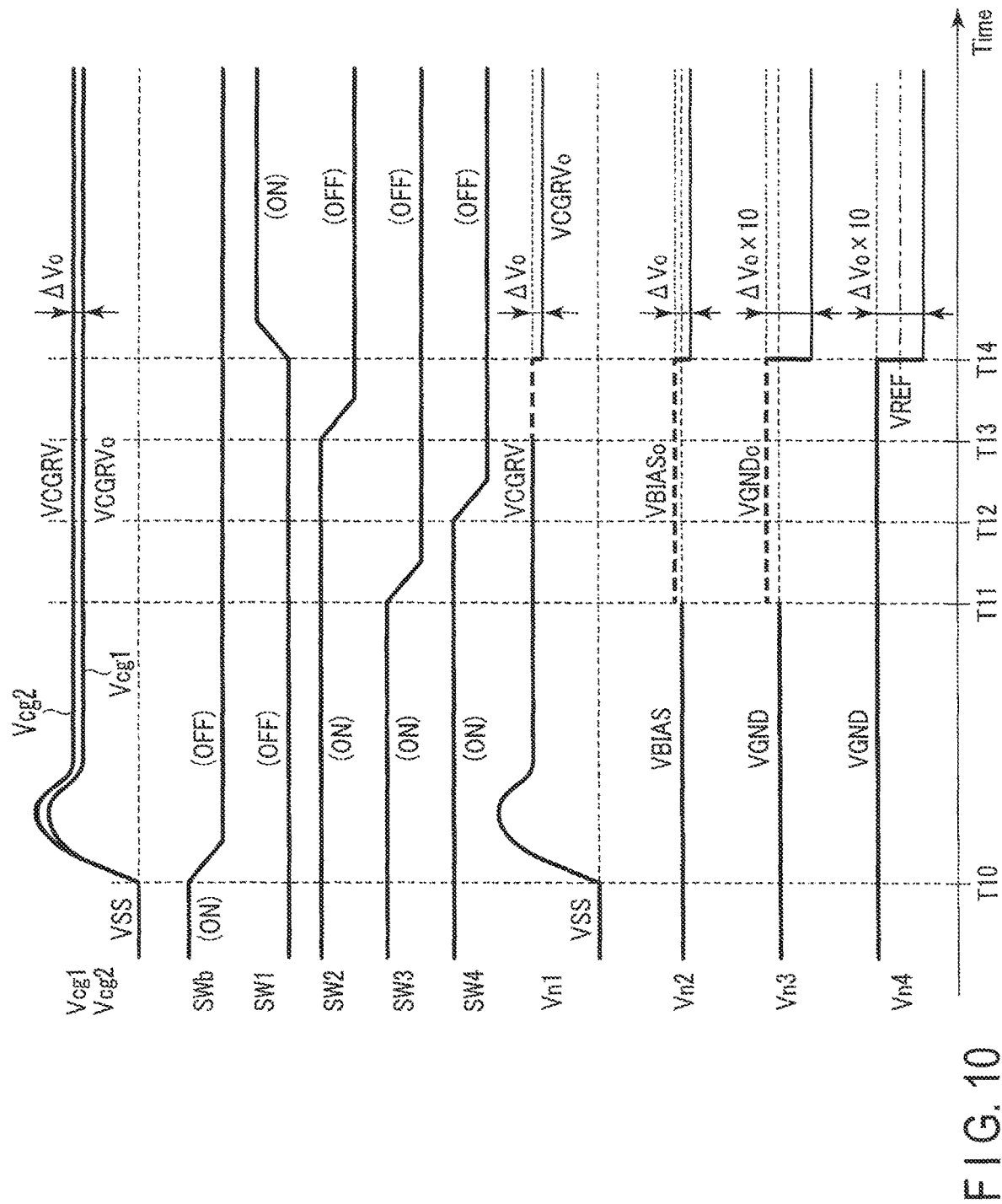
FIG. 10 shows an example of a timing chart showing temporal changes of various voltages at the time of execution of a flow-out detection operation by the semiconductor memory device according to the first embodiment.

FIG. 10 shows an example of a timing chart showing temporal changes of various voltages shown in FIG. 7 at the time of execution of a flow-out detection operation by the semiconductor memory device 1 according to the first embodiment. FIG. 10 shows temporal changes of voltages of control signals that are respectively input to some of the switches SW.

Even though the timing chart shown in FIG. 10 is independent of the timing chart shown in FIG. 8, reference is also made to the example of FIG. 8 in the description that follows, which will be given with reference to FIG. 10.

Prior to the start of a flow-out detection operation in the example of FIG. 10, for example, an H-level control signal is input to the gate of the switch SWb to bring the switch SWb to the on state, and the voltage VSS is applied to each of the nodes NCG1 and NCG2. This allows the voltages Vcg1 and Vcg2 to be stabilized at the voltage VSS. An L-level control signal is input to a gate of the switch SW1, bringing the switch SW1 to the off state. An H-level control signal is input to a gate of the switch SW2, bringing the switch SW2 to the on state. Since the switch SW1 is in the off state and the switch SW2 is in the on state, the switch SW2 in the on state transmits the voltage Vcg2 to the node N1. Thereby, the voltage Vn1 is stabilized at the voltage VSS. The configuration prior to the start of a flow-in detection operation described in the example of FIG. 9 similarly applies to the switches SW3 and SW4, and the voltages Vn2, Vn3, and Vn4.

From time T10 to completion of a flow-out detection operation, an L-level control signal is input to a gate of the switch SWb, bringing the switch SWb to the off state.

At time T10, control for causing the voltage to be output by the driver DRV to the node NCG2 coupled to the selected word line WL(sel) from the voltage VSS to the voltage VCGRV is started, as described with reference to time T00 in the example of FIG. 9. As a result, the voltage Vcg2 is stabilized at the voltage VCGRV.

The voltage output by the driver DRV to the node NCG2 is transmitted to the node NCG1 electrically coupled to the node NCG2, and as a result, the voltage Vcg1 is stabilized at a voltage VCGRVo. Here, a case will be described where a leakage current flows out from the selected word line WL(sel). The leakage current flows to, for example, the node NCG1 from the node NCG2 via the resistance RL, thus causing a voltage drop by the leakage current in the resistance RL. In this case, the voltage VCGRVo is lower than the voltage VCGRV by the voltage drop. FIG. 10 shows a voltage difference "ΔVo" between the voltage VCGRV and the voltage VCGRVo.

The level of the control signal input to the gate of each of the switches SW1, SW2, SW3, and SW4 is maintained. Since the voltage Vcg2 that the switch SW2 in the on state transmits to the node N1 changes at and after time T10, the voltage Vn1 changes in accordance with changes in the voltage Vcg2, and is stabilized at the voltage VCGRV, similarly to the voltage Vcg2.

At time T10, the voltage applied to the word line WL(adj) may be changed from the voltage VSS to the voltage VREAD, and the voltage applied to the source line SL may be changed from the voltage VSS to the voltage CELSRC, even though such a configuration is omitted in FIG. 10.

A case where a flow-out detection operation is started subsequent to a verify operation, as described with reference to FIG. 8, will be described. The increase of each of the voltages Vcg1, Vcg2, and Vn1 from the voltage VSS described above will be omitted. More specifically, when the switch SWb is switched from the on state to the off state at the start of a flow-out detection operation, the voltage Vcg2 is maintained at the voltage VCGRV, and the voltages Vcg1 and Vn1 change from the voltage VCGRV to the voltage VCGRVo and become stabilized. Other than this, the description given above as well as a description to be given below with reference to FIG. 10 apply.

A case where a flow-out detection operation is started subsequent to a flow-in detection operation, as described with reference to FIG. 8, will be described. The increase of each of the voltages Vcg1, Vcg2, and Vn1 from the voltage VSS described above will be omitted. Continuing from a flow-in detection operation, the switch SWb is maintained at the off state, and therefore the voltages Vcg2 and Vn1 are maintained at the voltage VCGRV, and the voltage Vcg1 is maintained at the voltage VCGRVi at the time of a flow-in detection operation. The voltage VCGRVi is equal to the voltage VCGRVo. At the start of a flow-out detection operation, the switches SW3 and SW4 are switched from the off state at the time of completion of a flow-in detection operation to the on state, the voltage Vn2 changes to the voltage VBIAS and becomes stabilized, and the voltages Vn3 and Vn4 change to the voltage VGND and become stabilized. A description to be given below with reference to FIG. 10 applies. The same applies to the case where a flow-in detection operation is started subsequent to a flow-out detection operation, even though such a configuration is omitted in the description given above with reference to FIG. 9.

Subsequently, at time T11, the level of the control signal input to the gate of the switch SW3 is changed to the L level, causing the switch SW3 to be switched from the on state to the off state, as described with reference to time T01 in the example of FIG. 9. In accordance with the switching of the switch SW3 to the off state, the voltage Vn2 changes and is stabilized at a voltage VBIASo, for example. In accordance with the change of the voltage Vn2, the voltage Vn3 changes and is stabilized at a voltage VGNDo. The voltage difference between the voltage VGNDo and the voltage VGND is, for example, 10 times greater than the voltage difference between the voltage VBIASo and the voltage VBIAS.

Subsequently, at time T12, the level of the control signal input to the gate of the switch SW4 is changed to the L level, causing the switch SW4 to be switched from the on state to the off state, as described with reference to time T02 in the example of FIG. 9.

Subsequently, at time T13, the level of the control signal input to the gate of the switch SW2 is changed to the L level, causing the switch SW2 to be switched from the on state to the off state.

Subsequently, at time T14, the level of the control signal input to the gate of the switch SW1 is changed to the H level, causing the switch SW1 to be switched from the off state to the on state. Since the switch SW1 is in the on state and the switch SW2 is in the off state, the switch SW1 in the on state transmits the voltage Vcg1 to the node N1. Thereby, the voltage Vn1 is stabilized at the voltage VCGRVo, similarly to the voltage Vcg1. In this manner, the voltage Vn1 decreases from the voltage VCGRV by the voltage difference ΔVo.

In accordance with the decrease of the voltage Vn1 by the voltage difference ΔVo, the voltages Vn2, Vn3, and Vn4 change as in the following, for a reason similar to the reason described regarding time T04 in the example of FIG. 9.

The voltage Vn2 decreases by the voltage difference ΔVo from the voltage VBIASo, similarly to the change in the voltage Vn1. In accordance with the decrease of the voltage Vn2 by the voltage difference ΔVo, the voltage Vn3 decreases from the voltage VGNDo. The amount of change of the voltage Vn3 is 10 times greater than the voltage difference ΔVo, which is an amount of change of the voltage Vn2. In accordance with the decrease of the voltage Vn3 by 10 times the voltage difference ΔVo, the voltage Vn4 decreases by 10 times the voltage difference ΔVo from the voltage VGND, similarly to the change in the voltage Vn3.

The comparator CMP outputs the signal FLG obtained as a result of comparison between the voltage Vn4 and the voltage VREF. As a result of the change of the voltage Vn4 at time T14, when the voltage Vn4 falls below the voltage VREF, as shown in FIG. 10, the level of the signal FLG output from the comparator CMP changes. The voltage VREF is, for example, identical to the voltage VREF used in the comparator CMP in the example of FIG. 9. The change in the level of the signal FLG means that a leakage current flowing out from the selected word line WL(sel) has been detected.

Comparative Example

FIG. 11 shows an example of a configuration of a driver set 19x of a semiconductor memory device according to a comparative example of the first embodiment.

The driver set 19x has a configuration in which the resistance RL and the leakage detection circuit LDC in the configuration of the driver set 19 shown in FIG. 7 are replaced with a resistance RLx and a comparator CMPX. The driver DRV and the switch SWb included in the driver set 19x are each coupled to a node NCG1 and/or a node NCG2, as described with reference to FIG. 7.

One end of the resistance RLx is coupled to the node NCG1, and the other end of the resistance RLx is coupled to the node NCG2. A first end of the comparator CMPx is coupled to the node NCG1, and a second end of the comparator CMPx is coupled to the node NCG2. The comparator CMPx performs, based on the voltages Vcg1 and Vcg2, a process of detecting a leakage current that flows into the selected word line WL(sel), and outputs a signal FLGx indicating whether or not a leakage current has been detected. The signal FLGx is, for example, sent to the sequencer 16x. The level of the signal FLGx differs according to whether or not the voltage vcg2 falls below the voltage Vcg1 by an amount greater than a permissible amount.

When a leakage current flows into the selected word line WL(sel), upon switching of the switch SWb from the on state to the off state, the leakage current flows from the node NCG1 via the resistance RLx to the node NCG2. This causes a voltage drop in the resistance RLx, thus making the voltage Vcg2, which is the same voltage as the voltage Vcg1, lower than the voltage Vcg1. When the voltage Vcg2 falls below the voltage Vcg1 beyond the permissible amount, the level of the signal FLGx changes. The change in the level of the signal FLGx means that a leakage current has been detected.

FIG. 12 shows an example of a timing chart showing temporal changes of voltages applied to various interconnects at the time of execution of a leakage detection operation LDx subsequent to a verify operation VF by the semiconductor memory device according to the comparative example of the first embodiment.

The semiconductor memory device performs a verify operation VF, as described with reference to FIG. 8, and then performs a leakage detection operation LDx. While the leakage detection operation LDx is performed, the switch SWb is controlled to be in the off state. In the leakage detection operation LDx, for example, a first flow-in detection operation LDIx1 is performed, and then a second flow-in detection operation LDIx2 is performed.

A description will be given of voltages applied to interconnects during the first flow-in detection operation LDIx1.

Similarly to the case of the leakage detection operation LD in the example of FIG. 8, the voltage output from the driver DRV to the node NCG2 and transferred to the selected word line WL(sel) is maintained at the voltage VCGRV, while the application of the voltage VREAD to the word line WL(adj) and the application of the voltage CELSRC to the source line SL are continued. The voltage VCGRV in the example of FIG. 12 is associated with, for example, one of the A state, the B state, and the C state, of the voltages VCGRV described with reference to FIG. 8.

In the first flow-in detection operation LDIx1, a leakage current that flows into the selected word line WL(sel) may be detected by the comparator CMPx, similarly to the flow-in detection operation LDI in the example of FIG. 8.

The leakage current is, similarly to the flow-in detection operation LDI in the example of FIG. 8, for example, based on a leakage current that flows into the selected word line WL(sel) from the word line WL(adj).

The second flow-in detection operation LDIx2 is performed when, for example, a leakage current is not detected by the first flow-in detection operation LDIx1. A case will be described where the second flow-in detection operation LDIx2 is performed.

After completion of the first flow-in detection operation LDIx1, the application of the voltage VREAD to the word line WL(adj) and the application of the voltage CELSRC to the source line SL are continued. On the other hand, after the completion of the first flow-in detection operation LDIx1, the voltage output from the driver DRV is changed from the voltage VCGRV. The changed voltage is, for example, a voltage lower than the voltage applied to the source line SL, such as the voltage VSS. A description will be given below based on the assumption that the changed voltage is the voltage VSS. The semiconductor memory device according to the comparative example waits until the voltage of the selected word line WL(sel) becomes stabilized, and performs the second flow-in detection operation LDIx2 after the waiting.

A description will be given of voltages applied to interconnects during the second flow-in detection operation LDIx2.

The voltage output from the driver DRV to the node NCG2 is maintained at the voltage VSS, while the application of the voltage VREAD to the word line WL(adj) and the application of the voltage CELSRC to the source line SL are continued.

In the second flow-in detection operation LDIx2, a leakage current that flows into the selected word line WL(sel) may be detected by the comparator CMPx. The leakage current is based on, for example, a leakage current that flows into the selected word line WL(sel) from the source line SL. Detection of a leakage current by the second flow-in detection operation LDIx2 suggests, for example, that a leakage current that flows out from the selected word line WL(sel) to the source line SL during the verify operation VF exists.

Advantageous Effects

The comparator CMPx of the semiconductor memory device according to the comparative example of the first embodiment outputs the signal FLGx at a level that differs according to whether the voltage Vcg2 falls below the voltage Vcg1 by an amount greater than a permissible amount.

When a leakage current flows into the selected word line WL(sel), upon switching of the switch SWb from the on state to the off state, the leakage current flows from the node NCG1 via the resistance RLx to the node NCG2. This causes a voltage drop in the resistance RLx, thus making the voltage Vcg2, which used to be the same voltage as the voltage Vcg1, lower than the voltage Vcg1. When the voltage Vcg2 falls below the voltage Vcg1 beyond the permissible amount, the level of the signal FLGx changes. In this manner, the comparator CMPx performs a process of detecting a leakage current that flows into the selected word line WL(sel). On the other hand, a case where the leakage current flows out from the selected word line WL(sel) is described as follows. Upon switching of the switch SWb from the on state to the off state, the leakage current flows from the node NCG2 via the resistance RLx to the node NCG1. This causes a voltage drop in the resistance RLx, thus making the voltage Vcg2 higher than the voltage Vcg1. Since the voltage Vcg2 does not become lower than the voltage Vcg1, the level of the signal FLGx does not change, and the comparator CMPx does not detect the leakage current.

On the other hand, the leakage detection circuit LDC of the semiconductor memory device 1 according to the first embodiment may perform both a process of detecting a leakage current that flows into the selected word line WL(sel) and a process of detecting a leakage current that flows out from the selected word line WL(sel). This is because, as described with reference to FIGS. 9 and 10, the leakage detection circuit LDC is capable of capturing a voltage drop in the resistance RL caused by a leakage current as a drop of the voltage Vn1 at the node N1, no matter which direction the leakage current flows in the selected word line WL(sel). More details will be described below.

In the example of FIG. 9, when a leakage current flows into the selected word line WL(sel), the leakage current flows from the node NCG1 via the resistance RL to the node NCG2, resulting in a voltage drop in the resistance RL, and the voltage Vcg2, which used to be the same as the voltage Vcg1, becomes lower than the voltage Vcg1. First, the voltage Vcg1 is transmitted via the switch SW1 to the node N1, and the voltage Vn1 is stabilized at the same voltage as the voltage Vcg1. Next, a voltage Vcg2 is transmitted via the switch SW2 to the node N1, and the voltage Vn1 is stabilized at the same voltage as the voltage Vcg2. In this manner, the voltage Vn1 is dropped from the same voltage as the voltage Vcg1 to a voltage the same as the voltage Vcg2.

In the example of FIG. 10, when a leakage current flows out from the selected word line WL(sel), the leakage current flows from the node NCG2 via the resistance RL to the node NCG1, resulting in a voltage drop in the resistance RL, and the voltage Vcg1, which used to be the same as the voltage Vcg2, becomes lower than the voltage Vcg2. First, a voltage Vcg2 is transmitted via the switch SW2 to the node N1, and the voltage Vn1 is stabilized at the same voltage as the voltage Vcg2. Next, the voltage Vcg1 is transmitted via the switch SW1 to the node N1, and the voltage Vn1 is stabilized at the same voltage as the voltage Vcg1. In this manner, the voltage Vn1 is dropped from the same voltage as the voltage Vcg2 to a voltage the same as the voltage Vcg1.

The leakage detection circuit LDC outputs the signal FLG at a level that differs according to whether or not a result of amplification of the drop amount of the voltage Vn1 by the amplifier circuit AMP exceeds a permissible amount. The permissible amount is determined by the voltage VREF. If the result of the amplification of the drop amount of the voltage Vn1 by the amplifier circuit AMP exceeds the permissible amount, the level of the signal FLG changes. In this manner, the leakage detection circuit LDC may perform both a process of detecting a leakage current that flows into the selected word line WL(sel), and a process of detecting a leakage current that flows out from the selected word line WL(sel), without the need for complicated trimming and/or offset correction.

Since the leakage detection circuit LDC uses a result of amplification by the amplifier circuit AMP, the leakage current can be detected even when the drop amount of the voltage Vn1 decreases as a result of a decrease in the value of the resistance RL. When the value of the resistance RL is small, upon occurrence of a voltage drop in the resistance RL by a leakage current, the time until the voltages of the nodes NCG1 and NCG2 are stabilized is shortened. Therefore, the semiconductor memory device 1 is capable of performing a leakage detection operation at high speed.

Moreover, according to the semiconductor memory device 1 of the first embodiment, advantageous effects to be described below are produced.

The voltage VCGRV output from the driver DRV to the node NCG2 while the semiconductor memory device according to the comparative example of the first embodiment performs a leakage detection operation is associated with, for example, one of the A state, the B state, and the C state, as described with reference to FIG. 12. The voltage VCGRV is relatively low, among the voltages VCGRV described with reference to FIG. 8. This is for the purpose of preventing a low withstand-voltage MOS transistor included in the comparator CMPx coupled to the nodes NCG1 and NCG2 from being destroyed as a result of a high-voltage application to the MOS transistor. The low withstand-voltage MOS transistor could be replaced with a high withstand-voltage MOS transistor; however, providing a high withstand-voltage MOS transistor may lead to an increase in circuit scale and deterioration in detection precision of a leakage current, which is not preferable.

On the other hand, the voltage VCGRV output from the driver DRV to the node NCG2 while the semiconductor memory device 1 according to the first embodiment performs a leakage detection operation is associated with, for example, one of the A state, the B state, the C state, the D state, the E state, the F state, and the G state, as described with reference to FIG. 8. That is, a voltage higher than that in the case of the comparative example is permitted as the voltage VCGRV. This is because a high withstand-voltage metallic capacitance element C1, for example, is interposed between the node N1, which is electrically coupled to the node NCG1 and/or the node NCG2, and the node N2, as shown in FIG. 7. By thus providing the capacitance element C1, the voltages Vn2 and Vn4 of nodes N2 and N4 respectively coupled to the amplifier circuit AMP and the comparator CMP are affected by the voltage VCGRV only a little.

In this manner, when the semiconductor memory device 1 according to the first embodiment performs a verify operation, a leakage detection operation can be performed subsequent to the verify operation, no matter which of the states the voltage VCGRV used in the verify operation is associated with. Thus, the semiconductor memory device 1 may, for example, increase the frequency of executing a leakage detection operation during execution of a write operation. Accordingly, the semiconductor memory device 1 according to the first embodiment may, for example, promptly stop a write operation to a block BLK that has been destroyed a posteriori and start a write operation to another block BLK, resulting in completion of the write operation earlier.

Moreover, according to the semiconductor memory device 1 of the first embodiment, advantageous effects to be described below are produced.

In the example of FIG. 12, the semiconductor memory device according to the comparative example of the first embodiment performs, after the verify operation VF, the second flow-in detection operation LDIx2 to detect a leakage current between the selected word line WL(sel) and the source line SL, which may exist during the verify operation VF. For execution of the second flow-in detection operation LDIx2, the semiconductor memory device makes the voltage output from the driver DRV and transferred to the selected word line WL(sel) lower than the voltage applied to the source line SL, from the voltage VCGRV at the time of the verify operation VF. This is because the comparator CMPx is capable of detecting a leakage current between the selected word line WL(sel) and the source line SL only as a flow-in from the source line SL to the selected word line WL(sel). The semiconductor memory device waits until the voltage of the selected word line WL(sel) is stabilized, and then performs the second flow-in detection operation LDIx2.

On the other hand, when FIG. 8 is taken as an example, the semiconductor memory device 1 according to the first embodiment performs, after the verify operation VF, the flow-out detection operation LDO to detect a leakage current between the selected word line WL(sel) and the source line SL, which may exist during the verify operation VF. For execution of the flow-out detection operation LDO, the semiconductor memory device 1 need not change the voltage output from the driver DRV and transferred to the selected word line WL(sel) from the voltage VCGRV at the time of the verify operation. This is because, even if the voltage of the selected word line WL(sel) is higher than the voltage of the source line SL, the leakage detection circuit LDC is capable of detecting a leakage current between the selected word line WL(sel) and the source line SL as a leakage current flowing out from the selected word line WL(sel). Thus, the semiconductor memory device 1 according to the first embodiment executes the flow-out detection operation LDO, without waiting as in the comparative example.

In this manner, when an operation of detecting a leakage current between the selected word line WL(sel) and the source line SL, which may exist during the verify operation, is performed after the verify operation, the semiconductor memory device 1 according to the first embodiment does not need to wait for an operation of detecting a leakage current, unlike in the comparative example. Therefore, the semiconductor memory device 1 according to the first embodiment can be operated at a higher speed than the comparative example.

[Modification]

Another operation example will be described in which the semiconductor memory device 1 performs a leakage detection operation. Features different from those of the above-described operation example and advantageous effects will be mainly described.

FIG. 13 shows an example of a timing chart showing temporal changes of voltages applied to various interconnects at the time of sequential execution of verify operations VF subsequent to a program operation PG by the semiconductor memory device 1 according to a modification of the first embodiment. FIG. 13 shows temporal changes of voltages of control signals that are respectively input to some of the switches SW.

In the example of FIG. 13, prior to start of the program operation PG, an H-level control signal is input to the gate of the switch SWb to bring the switch SWb to the on state, and the voltage VSS is applied to each of the selected word line WL(sel), the word line WL(adj), and the source line SL, for example.

The semiconductor memory device 1 performs a program operation PG. While the program operation PG is performed, the switch SWb is controlled, for example, to be in the on state. A description will be given of voltages applied to the interconnects during the program operation PG.

First, the voltage applied to the selected word line WL(sel) is changed from the voltage VSS to a voltage VPGM, the voltage applied to the word line WL(adj) is changed from the voltage VSS to a voltage VPASS, and the voltage applied to the source line SL is changed from the voltage VSS to a voltage CELSRC. The voltage VPGM is a voltage used for ejecting electrons into a charge storage layer of a selected memory cell transistor MT. The voltage VPASS is lower than the voltage VPGM. The voltage VPASS is a voltage at a level capable of suppressing programming to another memory cell transistor MT in a NAND string NS including a selected memory cell transistor MT into which electrons are ejected. Moreover, in a NAND string NS including a selected memory cell transistor MT into which electrons are not ejected, the voltage VPASS is a voltage at a level capable of increasing the potential of the channel by coupling to a degree by which a threshold voltage increase at the selected memory cell transistor MT can be suppressed. Upon completion of the program operation PG, for example, the voltages applied to the selected word line WL(sel), the word line WL(adj), and the source line SL are changed to the voltage VSS.

Subsequent to the program operation PG, the semiconductor memory device 1 sequentially performs some verify operations to verify whether or not the threshold voltage of each selected memory cell transistor MT has exceeded a predetermined voltage as a result of the program operation PG. FIG. 13 shows, as such verify operations, verify operations VFa, VFb, VFc, and VFd. The number of verify operations performed in this manner is not limited to four. The semiconductor memory device 1 performs the verify operations VFa, VFb, VFc, and VFd in order of appearance.

As described with reference to FIG. 8, the semiconductor memory device 1 may perform a leakage detection operation subsequent to each verify operation. In the example of FIG. 13, the semiconductor memory device 1 performs, subsequent to the verify operation VFa, a flow-in detection operation LDIa, and performs, subsequent to the verify operation VFd, a flow-out detection operation LDOd. While each of the verify operations VF is performed, for example, an H-level control signal is input to a gate of the switch SWb, and the switch SWb is controlled to be in the on state. On the other hand, while the flow-in detection operation LDIa and the flow-out detection operation LDOd are performed, an L-level control signal is input to the gate of the switch SWb, and the switch SWb is controlled to be in the off state.

A description will be given of voltages applied to interconnects during the verify operation VFa. The voltages applied to the interconnects are controlled, as described in relation to the verify operation VF with reference to FIG. 8. FIG. 13 shows a voltage VCGRV applied to the selected word line WL(sel) as a voltage VCGRVa. Of the voltages VCGRV described with reference to FIG. 8, the voltage VCGRVa is associated with, for example, a voltage VCGRV associated with the A state, which, in this case, is the lowest. FIG. 13 shows an example in which the voltage VCGRVa is lower than the voltage CELSRC; however, such a configuration is not necessarily required.

A description will be given of voltages applied to interconnects during the flow-in detection operation LDIa.

As described in relation to the flow-in detection operation LDI with reference to FIG. 8, the voltage output from the driver DRV and transferred to the selected word line WL(sel) is maintained at the voltage VCGRVa, while the application of the voltage VREAD to the word line WL(adj) and the application of the voltage CELSRC to the source line SL are continued.

Until the start of the flow-in detection operation LDIa, the level of the control signal input to the gate of each of the switches SW1, SW2, SW3, and SW4 is controlled in a manner similar to that at time T00 in the example of FIG. 9.

During execution of the flow-in detection operation LDIa, the levels of the control signals input to the gates of the switches SW1, SW2, SW3, and SW4 are sequentially changed, as described with reference to FIG. 9. Thereby, the signal FLG output from the leakage detection circuit LDC indicates whether or not a leakage current flowing into the selected word line WL(sel) has been detected. Upon completion of the flow-in detection operation LDIa, the level of the control signal input to the gate of each of the switches SW1, SW2, SW3, and SW4 is, for example, changed to a level prior to the start of the flow-in detection operation LDIa.

The application of the voltage VREAD to the word line WL(adj) and the application of the voltage CELSRC to the source line SL are continued during the verify operation VFb, . . . , the verify operation VFc, the verify operation VFd, and the flow-out detection operation LDOd, which are performed by the semiconductor memory device 1 subsequent thereto.

A description will be given of voltages transferred to the selected word line WL(sel) during the verify operation VFb. First, the voltage output from the driver DRV is changed from the voltage VCGRVa to the voltage VCGRVb. The voltage to be output is maintained at the voltage VCGRVb until completion of the verify operation VFb. The voltage VCGRVb is one of the voltages VCGRV that is higher than the voltage VCGRVa. FIG. 13 shows an example in which the voltage VCGRVb is higher than the voltage CELSRC; however, such a configuration is not necessarily required.

A description will be given of voltages transferred to the selected word line WL(sel) during the verify operation VFc. First, the voltage output from the driver DRV is changed to the voltage VCGRVc. The voltage to be output is maintained at the voltage VCGRVc until completion of the verify operation VFc. The voltage VCGRVc is one of the voltages VCGRV that is higher than the voltage VCGRVb.

A description will be given of voltages transferred to the selected word line WL(sel) during the verify operation VFd. First, the voltage output from the driver DRV is changed from the voltage VCGRVc to the voltage VCGRVd. The voltage to be output is maintained at the voltage VCGRVd until completion of the verify operation VFd. The voltage VCGRVd is one of the voltages VCGRV that is higher than the voltage VCGRVc. Of the voltages VCGRV, the voltage VCGRVd may be associated with, for example, a voltage VCGRV associated with the G state, which, in this case, is the highest VCGRV. The voltage VCGRVd is higher than the voltage CELSRC.

A description will be given of voltages transferred to the selected word line WL(sel) during the flow-out detection operation LDOd.

As described in relation to the flow-out detection operation LDO with reference to FIG. 8, the voltage output from the driver DRV is maintained at the voltage VCGRVd.

At the start of the flow-out detection operation LDOd, the level of the control signal input to the gate of the switch SW1 is changed from an H level to an L level, and the level of the control signal input to the gate of the switch SW2 is changed from the L level to the H level. Subsequently, as described with reference to FIG. 10, the levels of the control signals input to the gates of the switches SW1, SW2, SW3, and SW4 are sequentially changed. Thereby, the signal FLG output from the leakage detection circuit LDC indicates whether or not a leakage current that flows out from the selected word line WL(sel) has been detected. Upon completion of the flow-out detection operation LDOd, the level of the control signal input to the gate of each of the switches SW3 and SW4 is, for example, changed from the L level to the H level. Thereby, the level of the control signal input to the gate of each of the switches SW1, SW2, SW3, and SW4 becomes identical to a level prior to the start of the flow-out detection operation LDOd.

For example, a time ΔTva from start to completion of the verify operation VFa, a time ΔTvb from start to completion of the verify operation VFb, . . . , a time ΔTvc from start to completion of the verify operation VFc, and a time ΔTvd from start to completion of the verify operation VFd are set to be substantially identical. Moreover, for example, a time ΔTia from start to completion of the flow-in detection operation LDIa, and a time ΔTod from start to completion of the flow-out detection operation LDOd are set to be substantially identical.

Each of the times ΔTia and ΔTod is, for example, a time between 0.5 times to 1.5 times the times ΔTva, ΔTvb, ΔTvc, and ΔTvd.

An operation example performed by the semiconductor memory device 1 has been described above with reference to FIG. 13. In the example of FIG. 13, the flow-in detection operation LDIa is performed subsequent to the verify operation VFa, but a flow-out detection operation is not performed subsequent to the flow-in detection operation LDIa. A leakage detection operation is not performed subsequent to the verify operation VFb. A leakage detection operation is not performed subsequent to the verify operation VFc. The flow-out detection operation LDOd is performed subsequent to the verify operation VFd, but a flow-in detection operation is not performed subsequent to the flow-out detection operation LDOd.

When, for example, the value of the voltage VCGRV applied to the selected word line WL(sel) in a verify operation VF is smaller than a first threshold value, the semiconductor memory device 1 performs a flow-in detection operation subsequent to the verify operation VF. In this case, the semiconductor memory device 1 need not perform a flow-out detection operation subsequent to the flow-in detection operation. In the example of FIG. 13, a voltage VCGRVa used in the verify operation VFa satisfies such a condition, but the voltages VCGRV used in the other verify operations VFb, VFc, and VFd do not satisfy such a condition. A first threshold value is set in such a manner, for example, that at least one of the voltages VCGRV that may be used in a verify operation performed by the semiconductor memory device 1 satisfies such a condition.

When the value of the voltage VCGRV applied to the selected word line WL(sel) in a verify operation VF is greater than a second threshold value, the semiconductor memory device 1 performs, for example, a flow-out detection operation subsequent to the verify operation VF. In this case, the semiconductor memory device 1 need not perform a flow-in detection operation subsequent to the flow-out detection operation. In the example of FIG. 13, a voltage VCGRVd used in the verify operation VFd satisfies such a condition, but the voltages VCGRV used in the other verify operations VFa, VFb, and VFc do not satisfy such a condition. In the example of FIG. 13, the second threshold value and the first threshold value differ; however, the second threshold value may be equal to the first threshold value. The second threshold value is, for example, greater than the first threshold value. The second threshold value is set in such a manner, for example, that at least one of the voltages VCGRV that may be used in a verify operation performed by the semiconductor memory device 1 satisfies such a condition.

According to the semiconductor memory device 1 of the modification of the first embodiment, advantageous effects to be described below are further produced.

In the example of FIG. 13, the semiconductor memory device 1 performs the flow-in detection operation LDIa subsequent to the verify operation VFa. The voltage VCGRVa transferred to the selected word line WL(sel) in the verify operation VFa is a relatively low voltage, of the voltages VCGRV described with reference to FIG. 8. In such a case, a voltage difference between the voltage applied to the selected word line WL(sel) and the voltage VREAD applied to the word line WL(adj) is relatively large. Accordingly, when a leakage current that flows into the selected word line WL(sel) from the word line WL(adj) exists, the leakage current increases, allowing the semiconductor memory device 1 to detect a leakage current relatively easily in a flow-in detection operation. On the other hand, at the time of performing a verify operation, the semiconductor memory device 1 does not perform a flow-in detection operation subsequent to the verify operation when the voltage VCGRV used in the verify operation is a relatively high voltage.

Moreover, in the example of FIG. 13, the semiconductor memory device 1 performs the flow-out detection operation LDOd subsequent to the verify operation VFd. The voltage VCGRVd transferred to the selected word line WL(sel) in the verify operation VFd is a relatively high voltage, of the voltages VCGRV described with reference to FIG. 8. In such a case, a voltage difference between the voltage applied to the selected word line WL(sel) and the voltage CELSRC applied to the source line SL is relatively large. Accordingly, when a leakage current that flows out from the selected word line WL(sel) to the source line SL exists, the leakage current increases, allowing the semiconductor memory device 1 to detect a leakage current relatively easily in a flow-out detection operation. On the other hand, at the time of performing a verify operation, the semiconductor memory device 1 does not perform a flow-out detection operation subsequent to the verify operation when the voltage VCGRV used in the verify operation is a relatively low voltage.

In this manner, the semiconductor memory device 1 according to the modification of the first embodiment is capable of performing a flow-in detection operation when a leakage current that flows into the selected word line WL(sel) can be detected relatively easily, and is capable of performing a flow-out detection operation when a leakage current that flows out from the selected word line WL(sel) can be detected relatively easily. The semiconductor memory device 1 does not perform a leakage detection operation in the other cases, for example. Accordingly, the semiconductor memory device 1 according to the modification of the first embodiment is capable of providing a higher-speed operation while maintaining the detection precision of the leakage current at or above a certain level.

OTHER EMBODIMENTS

In the foregoing, a case has been described where the semiconductor memory device includes a leakage detection circuit that detects a leakage current flowing through an interconnect electrically coupled to the selected word line. The semiconductor memory device may further include a leakage detection circuit that detects a leakage current flowing through another interconnect, with a configuration similar to the above-described leakage detection circuit.

Herein, the term "couple" refers to electrical connection, and does not exclude, for example, intervention of another element therebetween.

Terms such as "identical", "equal", "constant", and "maintain" used herein are intended to tolerate variations within the design range at the time of implementation of the technique described in the embodiment. The same applies to the case where the term "substantially" is used in addition to such terms, such as "substantially identical". Moreover, the term "applying" or "supplying" of a voltage means both performing control to apply or supply the voltage, and actually applying or supplying the voltage. Furthermore, applying or supplying of a voltage may include, for example, applying or supplying a voltage of 0 V.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor memory device, comprising:
a memory cell;
a first word line coupled between a control end of the memory cell and a first node;
a resistance element coupled between the first node and a second node;
a control circuit configured to output a voltage to the second node;
a first switch coupled between the first node and a third node;
a second switch coupled between the second node and the third node; and
a comparator including an input end that receives a signal corresponding to a voltage of the third node.

2. The device according to claim 1, further comprising:
a first capacitance element including a first electrode coupled to the third node and a second electrode coupled to a fourth node, wherein
the input end of the comparator receives a signal corresponding to the voltage of the third node via the fourth node.

3. The device according to claim 2, further comprising:
an amplification circuit including an input end coupled to the fourth node and an output end coupled to a fifth node; and
a second capacitance element including a third electrode coupled to the fifth node and a fourth electrode coupled to a sixth node, wherein
the input end of the comparator is coupled to the sixth node, and receives the signal corresponding to the voltage of the third node via the sixth node and the fifth node.

4. The device according to claim 3, further comprising:
a third switch coupled between the fourth node and a first reference potential node; and
a fourth switch coupled between the sixth node and a second reference potential node.

5. The device according to claim 1, wherein
the control circuit is further configured to transmit a first signal to a control end of the first switch and transmit a second signal to a control end of the second switch,
a level of a voltage of a signal output from the comparator changes in accordance with switching of a voltage of the first signal from a first level to a third level and switching of a voltage of the second signal from a second level to a fourth level subsequent to a period during which the voltage of the first signal is at the first level and the voltage of the second signal is at the second level,
the second level being lower than the fourth level if the first level is higher than the third level, and
the second level being higher than the fourth level if the first level is lower than the third level.

6. The device according to claim 5, wherein
the control circuit is further configured to start outputting a first voltage to the second node in a verify operation on the memory cell, and
the change of the signal output from the comparator occurs during the output of the first voltage.

7. The device according to claim 1, wherein
the control circuit is further configured to start outputting a first voltage to the first word line via the second node in a verify operation on the memory cell,
the control circuit is further configured to transmit a first signal to a control end of the first switch and transmit a second signal to a control end of the second switch,
a period during which the first voltage is output to the first word line includes a first period during which a voltage of the first signal is at a first level and a voltage of the second signal is at a second level, and a second period during which the voltage of the first signal is at a third level and the voltage of the second signal is at a fourth level,
the first level being higher than the third level, and the second level being lower than the fourth level.

8. The device according to claim 7, further comprising:
a source line coupled to the memory cell and a second word line which is a word line adjacent to the first word line, wherein
the control circuit is further configured to output a second voltage higher than the first voltage to the second word line and output a third voltage lower than the first voltage to the source line, and
the first period and the second period are included in a period during which the second voltage is output to the second word line and the third voltage is output to the source line.

9. The device according to claim 1, wherein
the control circuit is further configured to start outputting a first voltage to the first word line via the second node in a verify operation on the memory cell,
the control circuit is further configured to transmit a first signal to a control end of the first switch and transmit a second signal to a control end of the second switch,
a period during which the first voltage is output to the first word line includes: a first period during which a voltage of the first signal is at a first level and a voltage of the second signal is at a second level; a second period which is after the first period and in which the voltage of the first signal is at a third level and the voltage of the second signal is at a fourth level; and a third period which is after the second period and in which the voltage of the first signal is at the first level and the voltage of the second signal is at the second level,
the second level being lower than the fourth level if the first level is higher than the third level, and
the second level being higher than the fourth level if the first level is lower than the third level.

10. The device according to claim 9, further comprising:
a source line coupled to the memory cell and a second word line which is a word line adjacent to the first word line, wherein
the control circuit is further configured to output a second voltage higher than the first voltage to the second word line and output a third voltage lower than the first voltage to the source line, and
the first period, the second period, and the third period are included in a period during which the second voltage is output to the second word line and the third voltage is output to the source line.

11. The device according to claim 1, wherein
the control circuit is further configured to:
start outputting a first voltage to the first word line via the second node in a first: verify operation on the memory cell to apply a lowest verify voltage to the memory cell; and
start outputting a second voltage to the first word line via the second node in a second verify operation on the memory cell to apply a highest verify voltage to the memory cell,
the control circuit is further configured to transmit a first signal to a control end of the first switch and transmit a second signal to a control end of the second switch,
a period during which the first voltage is output to the first word line includes a first period during which a voltage of the first signal is at a first level and a voltage of the second signal is at a second level and a second period which is after the first period and during which the voltage of the first signal is at a third level and the voltage of the second signal is at a fourth level,
the second level being lower than the fourth level if the first level is higher than the third level,
the second level being higher than the fourth level if the first level is lower than the third level, and
a period during which the second voltage is output to the first word line includes a third period during which the voltage of the first signal is at the third level and the voltage of the second signal is at the fourth level, and a fourth period which is after the third period and during which the voltage of the first signal is at the first level and the voltage of the second signal is at the second level.

12. The device according to claim 11, wherein
the first level is higher than the third level, and the second level is lower than the fourth level.

13. A semiconductor memory device, comprising:
a memory cell;
a first word line coupled between a control end of the memory cell and a first node;
a resistance element coupled between the first node and a second node;
a control circuit configured to output a voltage to the second node; and
a detection circuit coupled to the first node and the second node and configured to:
selectively acquire a voltage of one of the first node and the second node and then acquire a voltage of the other node of the first node and the second node; and
change a level of a voltage of a first signal to be output, in accordance with the voltage of the other node being higher than the selectively acquired voltage, or
change the level of the voltage of the first signal in accordance with the voltage of the other node being lower than the selectively acquired voltage.

14. The device according to claim 13, wherein
the detection circuit includes:
a first switch coupled between the first node and a third node; and
a second switch coupled between the second node and the third node,
acquisition of the voltage of the first node by the detection circuit is performed via the third node by turning on the first switch, and
acquisition of the voltage of the second node by the detection circuit is performed via the third node by turning on the second switch.

15. The device according to claim 14, wherein
the detection circuit further includes:
a first capacitance element including a first electrode coupled to the third node and a second electrode coupled to a fourth node; and
a comparator including an input end that receives a signal corresponding to a voltage of the third node via the fourth node and configured to output the first signal.

16. The device according to claim 13, wherein
the control circuit is further configured to start outputting a first voltage to the first word line via the second node in a verify operation on the memory cell to apply a highest verify voltage to the memory cell, and
acquisition of the voltages of the first node and the second node by the detection circuit is performed during the output of the first voltage to the first word line.

17. The device according to claim 16, further comprising:
a source line coupled to the memory cell and a second word line which is a word line adjacent to the first word line, wherein
the control circuit is further configured to output a second voltage higher than the first voltage to the second word line and output a third voltage lower than the first voltage to the source line, and
acquisition of the voltages of the first node and the second node by the detection circuit is performed during the output of the second voltage to the second word line and the output of the third voltage to the source line.

* * * * *